(12) United States Patent
Tang et al.

(10) Patent No.: US 12,272,928 B2
(45) Date of Patent: Apr. 8, 2025

(54) OPTICAL TRANSMISSION MODULE, OPTICAL TRANSMISSION-RECEPTION MODULE AND OPTICAL MODULE

(71) Applicant: Hisense Broadband Multimedia Technologies Co., Ltd., Shandong (CN)

(72) Inventors: Yi Tang, Shandong (CN); Jinlei Chen, Shandong (CN); Feng Cui, Shandong (CN); Yifan Xie, Shandong (CN); Qinhao Fu, Shandong (CN); Lin Yu, Shandong (CN)

(73) Assignee: HISENSE BROADBAND MULTIMEDIA TECHNOLOGIES CO., LTD., Shandong (CN)

( * ) Notice: Subject to any disclaimer, the term of this patent is extended or adjusted under 35 U.S.C. 154(b) by 984 days.

(21) Appl. No.: 17/219,200

(22) Filed: Mar. 31, 2021

(65) Prior Publication Data
US 2021/0218217 A1      Jul. 15, 2021

Related U.S. Application Data

(63) Continuation-in-part of application No. PCT/CN2020/074289, filed on Feb. 4, 2020.

(30) Foreign Application Priority Data

Mar. 14, 2019   (CN) .......................... 201910193165.8
May 24, 2019   (CN) .......................... 201910440362.5

(51) Int. Cl.
*H01S 5/14*         (2006.01)
*H04B 10/50*       (2013.01)

(52) U.S. Cl.
CPC ........... *H01S 5/141* (2013.01); *H04B 10/505* (2013.01); *H04B 10/506* (2013.01)

(58) Field of Classification Search
CPC .... H01S 5/1411; H04B 10/505; H04B 10/506
See application file for complete search history.

(56) References Cited

U.S. PATENT DOCUMENTS 5,357,122 A * 10/1994 Okubora ................. H01L 23/48
                                                                     257/E27.128
5,393,371 A *  2/1995 Chang ................. H01S 3/06704
                                                                     216/33

(Continued)

FOREIGN PATENT DOCUMENTS

CN          1191023 A        8/1998
CN          1735822 A        2/2006

(Continued)

OTHER PUBLICATIONS

English language translation of JP-2011525293-A (Year: 2011).*

(Continued)

*Primary Examiner* — Peter Radkowski
(74) *Attorney, Agent, or Firm* — Morgan, Lewis & Bockius LLP

(57) ABSTRACT

An optical transmission module includes a housing having a cavity therein and an optical transmission device encapsulated in the cavity. The optical transmission device includes an optical waveguide substrate, laser assemblies, an optical multiplexing assembly and main waveguides. The optical waveguide substrate includes a surface and a first reflection inclined surface having an acute angle therebetween. The laser assemblies are disposed on the surface of the optical waveguide substrate, and are configured to emit laser beams towards the surface of the optical waveguide substrate. The optical multiplexing assembly is disposed in the optical waveguide substrate, and is configured to combine the laser beams into a laser beam. The main waveguides are disposed inside the optical waveguide substrate, light inlet ends of the main waveguides face the first inclined surface, and light (Continued)

outlet ends of the main waveguides are communicated with the optical multiplexing assembly.

16 Claims, 12 Drawing Sheets

(56) References Cited

U.S. PATENT DOCUMENTS

| | | | | |
|---|---|---|---|---|
| 6,052,222 A * | 4/2000 | Kitamura | ............ | H01S 5/50 |
| | | | | 359/344 |
| 6,298,178 B1 * | 10/2001 | Day | ............ | G02B 6/125 |
| | | | | 385/129 |
| 6,406,196 B1 * | 6/2002 | Uno | ............ | G02B 6/4214 |
| | | | | 385/47 |
| 6,418,246 B1 * | 7/2002 | Gampp | ............ | G02B 6/122 |
| | | | | 385/11 |
| 6,438,280 B1 * | 8/2002 | Gampp | ............ | G02F 1/035 |
| | | | | 385/44 |
| 6,456,766 B1 * | 9/2002 | Shaw | ............ | G02B 6/423 |
| | | | | 385/47 |
| 6,480,639 B2 * | 11/2002 | Hashimoto | ............ | G02B 6/4246 |
| | | | | 372/50.1 |
| 6,789,959 B1 * | 9/2004 | Conn | ............ | G02B 6/4214 |
| | | | | 385/94 |
| 6,807,326 B2 * | 10/2004 | Han | ............ | G02B 6/12004 |
| | | | | 385/94 |
| 6,856,735 B2 * | 2/2005 | Chang | ............ | G02B 6/2852 |
| | | | | 385/48 |
| 6,885,795 B1 * | 4/2005 | Hsu | ............ | G02B 6/122 |
| | | | | 385/48 |
| 6,915,047 B1 * | 7/2005 | Mekis | ............ | G02B 6/42 |
| | | | | 385/39 |
| 6,947,671 B2 * | 9/2005 | Sekiya | ............ | G02B 6/4214 |
| | | | | 359/489.14 |
| 7,031,575 B2 * | 4/2006 | Blauvelt | ............ | G02B 6/30 |
| | | | | 385/39 |
| 7,050,691 B2 * | 5/2006 | Ishizaki | ............ | G02B 6/132 |
| | | | | 264/2.3 |
| 7,057,716 B2 * | 6/2006 | Yap | ............ | H01Q 3/2676 |
| | | | | 356/141.5 |
| 7,076,125 B2 * | 7/2006 | Kouta | ............ | G01J 1/04 |
| | | | | 385/44 |
| 7,095,913 B2 * | 8/2006 | Bloom | ............ | G02B 6/3596 |
| | | | | 385/24 |
| 7,181,098 B2 * | 2/2007 | Kwon | ............ | G02B 6/4246 |
| | | | | 385/129 |
| 7,200,289 B2 * | 4/2007 | Yamada | ............ | G02F 1/225 |
| | | | | 385/48 |
| 7,310,453 B2 * | 12/2007 | Ichikawa | ............ | G02F 1/225 |
| | | | | 385/2 |
| 7,330,619 B2 * | 2/2008 | Vernooy | ............ | G02B 6/12002 |
| | | | | 385/39 |
| 7,359,581 B2 * | 4/2008 | Miyazaki | ............ | G02B 6/30 |
| | | | | 385/48 |
| 7,373,044 B2 * | 5/2008 | Sekiya | ............ | G02B 6/4214 |
| | | | | 359/837 |
| 7,489,840 B2 * | 2/2009 | Sekiya | ............ | G02B 6/4209 |
| | | | | 359/489.08 |
| 7,526,161 B2 * | 4/2009 | Ishii | ............ | G02B 6/29385 |
| | | | | 385/48 |
| 7,532,778 B2 * | 5/2009 | Yamada | ............ | G02F 1/035 |
| | | | | 385/48 |
| 7,684,667 B2 * | 3/2010 | Kim | ............ | G02B 6/4214 |
| | | | | 385/47 |
| 7,769,255 B2 * | 8/2010 | Nagy | ............ | G02B 6/356 |
| | | | | 385/47 |
| 7,792,399 B2 * | 9/2010 | Kato | ............ | G02B 6/3514 |
| | | | | 385/18 |
| 7,903,911 B2 * | 3/2011 | Sekiya | ............ | G02B 6/4209 |
| | | | | 385/36 |
| 8,000,568 B2 * | 8/2011 | Presley | ............ | G02B 6/3594 |
| | | | | 359/872 |
| 8,050,525 B2 * | 11/2011 | Shen | ............ | H04B 10/506 |
| | | | | 385/37 |
| 8,131,123 B2 * | 3/2012 | Presley | ............ | G02B 6/29313 |
| | | | | 385/47 |
| 8,288,157 B2 * | 10/2012 | Duer | ............ | G01N 21/7703 |
| | | | | 436/805 |
| 8,483,525 B2 * | 7/2013 | Kitoh | ............ | G02B 6/12019 |
| | | | | 385/14 |
| 8,625,943 B2 * | 1/2014 | Soma | ............ | G02B 6/12019 |
| | | | | 385/38 |
| 8,675,199 B2 * | 3/2014 | Duer | ............ | G02B 6/4226 |
| | | | | 385/12 |
| 8,704,447 B2 * | 4/2014 | Ide | ............ | G02B 6/12007 |
| | | | | 359/326 |
| 8,747,751 B2 * | 6/2014 | Duer | ............ | G01N 21/6452 |
| | | | | 385/12 |
| 8,750,712 B2 * | 6/2014 | Ruiz | ............ | G02B 6/42 |
| | | | | 398/135 |
| 8,811,778 B2 * | 8/2014 | Bicknell | ............ | G02B 6/125 |
| | | | | 385/83 |
| 8,861,970 B2 * | 10/2014 | Paslaski | ............ | G02B 6/4246 |
| | | | | 398/115 |
| 8,867,873 B2 * | 10/2014 | Kamei | ............ | G02B 6/12026 |
| | | | | 385/24 |
| 9,020,307 B2 * | 4/2015 | Ishikawa | ............ | G02B 6/243 |
| | | | | 385/38 |
| 9,081,214 B2 * | 7/2015 | Oikawa | ............ | G02F 1/225 |
| 9,178,622 B2 * | 11/2015 | Ruiz | ............ | G02B 6/4283 |
| 9,240,671 B2 * | 1/2016 | Ide | ............ | H01S 5/02325 |
| 9,423,397 B2 * | 8/2016 | Duer | ............ | C12Q 1/6825 |
| 9,442,251 B2 * | 9/2016 | Sakai | ............ | G03F 7/16 |
| 9,528,939 B2 * | 12/2016 | Duer | ............ | G01N 21/6452 |
| 9,588,395 B2 * | 3/2017 | Jewart | ............ | G02F 1/2257 |
| 9,612,410 B2 * | 4/2017 | Oguro | ............ | G02B 6/4246 |
| 9,684,129 B2 * | 6/2017 | Ishikawa | ............ | G02B 6/12 |
| 9,703,086 B1 * | 7/2017 | Chen | ............ | G02B 6/4214 |
| 9,857,534 B2 * | 1/2018 | Kusaka | ............ | G02B 6/14 |
| 9,952,389 B2 * | 4/2018 | Katsuyama | ............ | G02B 6/124 |
| 10,126,502 B2 * | 11/2018 | Ishikawa | ............ | G02B 6/2552 |
| 10,180,545 B2 * | 1/2019 | Wang | ............ | G02B 6/4208 |
| 10,288,823 B2 * | 5/2019 | Tsujita | ............ | G02B 6/032 |
| 10,355,448 B2 * | 7/2019 | Sugiyama | ............ | H01S 5/101 |
| 10,408,999 B2 * | 9/2019 | Katsuyama | ............ | G02B 6/124 |
| 10,487,356 B2 * | 11/2019 | Lundquist | ............ | G01N 21/648 |
| 10,551,318 B2 * | 2/2020 | Duer | ............ | G01N 21/7703 |
| 10,923,877 B2 * | 2/2021 | Chen | ............ | G02B 6/4286 |
| 11,287,571 B2 * | 3/2022 | Katsuyama | ............ | G03B 21/2066 |
| 2002/0001427 A1 * | 1/2002 | Hashimoto | ............ | G02B 6/4246 |
| | | | | 385/14 |
| 2003/0019838 A1 * | 1/2003 | Shaw | ............ | G02B 6/4228 |
| | | | | 216/20 |
| 2003/0086651 A1 * | 5/2003 | Chang | ............ | G02B 6/12004 |
| | | | | 385/48 |
| 2003/0235375 A1 * | 12/2003 | Kamath | ............ | G02B 6/4277 |
| | | | | 385/92 |
| 2004/0028351 A1 * | 2/2004 | Han | ............ | G02B 6/12004 |
| | | | | 385/92 |
| 2004/0131302 A1 * | 7/2004 | Kouta | ............ | G01J 1/04 |
| | | | | 385/14 |
| 2004/0197044 A1 * | 10/2004 | Bloom | ............ | G02B 6/3596 |
| | | | | 385/16 |
| 2004/0234224 A1 * | 11/2004 | Ishizaki | ............ | G02B 6/1221 |
| | | | | 385/129 |
| 2004/0247230 A1 * | 12/2004 | Kwon | ............ | G02B 6/4246 |
| | | | | 385/14 |
| 2004/0258354 A1 * | 12/2004 | Sekiya | ............ | G02B 6/4292 |
| | | | | 385/35 |
| 2004/0264913 A1 * | 12/2004 | Vernooy | ............ | G02B 6/12002 |
| | | | | 385/147 |
| 2005/0008314 A1 * | 1/2005 | Drake | ............ | G02B 6/136 |
| | | | | 216/2 |
| 2005/0078913 A1 * | 4/2005 | Blauvelt | ............ | G02B 6/29352 |
| | | | | 385/39 |
| 2005/0088339 A1 * | 4/2005 | Yap | ............ | H01Q 3/2676 |
| | | | | 342/375 |
| 2005/0105842 A1 * | 5/2005 | Vonsovici | ............ | G02B 6/122 |
| | | | | 385/14 |

(56) References Cited

U.S. PATENT DOCUMENTS

| | | | |
|---|---|---|---|
| 2005/0105848 A1* | 5/2005 | Yamada | G02B 6/4214 385/33 |
| 2005/0226626 A1 | 10/2005 | Zhang et al. | |
| 2005/0284180 A1* | 12/2005 | Sekiya | G02B 6/4214 65/66 |
| 2006/0002713 A1* | 1/2006 | Sekiya | G02B 6/4214 398/141 |
| 2006/0110089 A1* | 5/2006 | Ichikawa | G02F 1/225 385/14 |
| 2006/0133713 A1* | 6/2006 | Yamada | G02F 1/035 385/5 |
| 2007/0076999 A1* | 4/2007 | Miyazaki | G02B 6/30 359/315 |
| 2008/0019632 A1* | 1/2008 | Ishii | G02F 1/225 385/2 |
| 2008/0049804 A1* | 2/2008 | Hashimoto | H01S 5/227 257/E33.049 |
| 2008/0089697 A1* | 4/2008 | Shen | H04B 10/0799 257/E33.07 |
| 2009/0067778 A1* | 3/2009 | Kim | G02B 6/12007 385/14 |
| 2009/0068668 A1* | 3/2009 | Duer | G01N 33/54373 436/86 |
| 2009/0110349 A1* | 4/2009 | Presley | G02B 6/29311 385/17 |
| 2009/0148099 A1* | 6/2009 | Sekiya | G02B 6/4209 385/33 |
| 2009/0185776 A1* | 7/2009 | Kato | G02B 6/3514 385/16 |
| 2009/0232446 A1* | 9/2009 | Nagy | G02B 6/29311 385/18 |
| 2009/0304328 A1* | 12/2009 | Presley | G02B 6/3588 356/477 |
| 2009/0312188 A1* | 12/2009 | Duer | B01L 3/502715 506/38 |
| 2010/0302544 A1* | 12/2010 | Duer | G02B 6/4226 385/27 |
| 2010/0303412 A1* | 12/2010 | Okuno | G02B 6/4206 385/39 |
| 2011/0064355 A1* | 3/2011 | Soma | G02B 6/12019 385/38 |
| 2011/0110624 A1* | 5/2011 | Kamei | G02B 6/12016 385/24 |
| 2011/0164875 A1* | 7/2011 | Bicknell | G02B 6/43 398/43 |
| 2011/0268447 A1* | 11/2011 | Kitoh | G02B 6/12016 385/24 |
| 2011/0268450 A1* | 11/2011 | Paslaski | H04B 10/43 398/115 |
| 2012/0057880 A1* | 3/2012 | Ruiz | H04B 10/501 398/136 |
| 2012/0068609 A1* | 3/2012 | Ide | G02B 6/12004 315/152 |
| 2012/0251041 A1* | 10/2012 | Ishikawa | G02B 6/30 385/24 |
| 2013/0071850 A1* | 3/2013 | Duer | G01N 21/0332 435/7.1 |
| 2013/0215425 A9* | 8/2013 | Duer | G02B 6/4226 385/27 |
| 2013/0251301 A1* | 9/2013 | Oikawa | G02F 1/225 385/2 |
| 2014/0178861 A1* | 6/2014 | Duer | G01N 33/54373 435/7.1 |
| 2014/0293402 A1* | 10/2014 | Ide | H01S 5/4093 359/326 |
| 2014/0321807 A1* | 10/2014 | Sakai | G02B 6/30 385/14 |
| 2014/0328600 A1* | 11/2014 | Ruiz | G02B 6/4246 398/136 |
| 2015/0205043 A1* | 7/2015 | Ishikawa | G02B 6/243 385/38 |
| 2015/0241633 A1* | 8/2015 | Kusaka | G02F 1/2255 385/24 |
| 2016/0170156 A1* | 6/2016 | Oguro | G02B 6/4206 385/14 |
| 2016/0273034 A1* | 9/2016 | Lundquist | C12Q 1/6874 |
| 2016/0357085 A1* | 12/2016 | Jewart | G02B 6/122 |
| 2017/0067829 A1* | 3/2017 | Duer | G01N 21/6452 |
| 2017/0146742 A1* | 5/2017 | Ishikawa | G02B 6/1228 |
| 2017/0146744 A1* | 5/2017 | Katsuyama | H04N 9/3105 |
| 2017/0192214 A1* | 7/2017 | Chen | G02B 6/4208 |
| 2017/0269311 A1* | 9/2017 | Wang | G02B 6/4204 |
| 2017/0329079 A1* | 11/2017 | Tsujita | G02B 6/032 |
| 2017/0353008 A1* | 12/2017 | Sugiyama | H01S 5/142 |
| 2018/0191128 A1* | 7/2018 | Chen | G02B 6/12004 |
| 2019/0107675 A1* | 4/2019 | Katsuyama | G02B 6/124 |
| 2019/0339451 A1* | 11/2019 | Katsuyama | H04N 9/3161 |
| 2020/0348467 A1* | 11/2020 | Katsuyama | G02B 6/12 |
| 2021/0286127 A1* | 9/2021 | Katsuyama | G03B 21/2066 |

FOREIGN PATENT DOCUMENTS

| | | | | |
|---|---|---|---|---|
| CN | 101278218 A | * | 10/2008 | G02B 6/125 |
| CN | 101975981 A | | 2/2011 | |
| CN | 203747159 U | | 7/2014 | |
| CN | 104601246 A | | 5/2015 | |
| CN | 204669368 U | | 9/2015 | |
| CN | 106291810 A | | 1/2017 | |
| CN | 206274709 U | | 6/2017 | |
| CN | 207427713 U | | 5/2018 | |
| CN | 207764430 U | | 8/2018 | |
| CN | 108873195 A | | 11/2018 | |
| CN | 109143497 A | | 1/2019 | |
| CN | 109814201 A | | 5/2019 | |
| CN | 110133809 A | | 8/2019 | |
| EP | 1396741 A1 | * | 3/2004 | G02B 6/122 |
| EP | 2378329 A1 | * | 10/2011 | G02B 6/12016 |
| GB | 2461026 A | * | 12/2009 | B01L 3/502715 |
| JP | H11248954 A | | 9/1999 | |
| JP | 2000075155 A | * | 3/2000 | |
| JP | 2004157192 A | * | 6/2004 | |
| JP | 2011525293 A | * | 9/2011 | |
| JP | 2012-37617 A | | 2/2012 | |
| JP | 2019095485 A | * | 6/2019 | |
| WO | WO-2004034530 A1 | * | 4/2004 | G02B 6/12019 |

OTHER PUBLICATIONS

First Office Action issued in corresponding Chinese Patent Application No. 201910193165.8 issued Mar. 27, 2020, with English translation.

Second Office Action issued in corresponding Chinese Patent Application No. 201910193165.8 issued Oct. 22, 2020, with English translation.

First Office Action issued in corresponding Chinese Patent Application No. 201910440362.5 issued Feb. 25, 2020, with English translation.

Second Office Action issued in corresponding Chinese Patent Application No. 201910440362.5 issued Aug. 7, 2020, with English translation.

International Search Report and Written Opinion issued in corresponding International Patent Application No. PCT/CN2020/074289 mailed Apr. 24, 2020, with English translation.

Office Action issued in corresponding Chinese Patent Application No. 202110001065.8 dated Jan. 13, 2022, with English translation.

* cited by examiner

OPTICAL TRANSMISSION MODULE, OPTICAL TRANSMISSION-RECEPTION MODULE AND OPTICAL MODULE

CROSS-REFERENCE TO RELATED APPLICATIONS

This application is a Bypass Continuation-in-Part Application of PCT/CN2020/074289 filed on Feb. 4, 2020, which claims priorities to Chinese Patent Application No. 201910193165.8 filed on Mar. 14, 2019 and Chinese Patent Application No. 201910440362.5 filed on May 24, 2019, which are incorporated herein by reference in their entirety.

TECHNICAL FIELD

The present disclosure relates to the field of optical fiber communication technologies, and in particular, to an optical transmission module, an optical transmission-reception module, and an optical module.

BACKGROUND

An optical fiber communication system is a communication system that converts electrical signals to optical signals through electronic-to-optical conversion, uses extremely thin optical guide fibers (optical fibers for short) formed by drawing glass or plastic as transmission media, and uses optical signals as carrier waves to transmit information. Optical fiber communication systems are ideal channels for digital communications. Compared with analog communications, digital communications have many advantages, such as high sensitivity and good transmission quality. Therefore, digital transmission is generally used in large-capacity and long-distance optical fiber communication systems.

Global optical communication is in a period of rapid development, and the requirement for communication bandwidth in the field of optical fiber communication is also increasing. In the field of optical fiber communication, in order to ensure that digital data may be transmitted at a high speed over a long distance, a single-mode optical fiber is generally used as a transmission medium, and optical modules (an optical transmission module and an optical reception module) are used to realize transmission and reception of light with different wavelengths.

SUMMARY

In one aspect, an optical transmission module is provided. The optical transmission module includes a housing having a cavity therein, a circuit board, an optical fiber adapter configured to fix an optical fiber, and an optical transmission device encapsulated in the cavity. One end of the optical transmission device is matched with the optical fiber adapter, and another end of the optical transmission device is electrically connected to the circuit board. The optical transmission device includes an optical waveguide substrate, a plurality of laser assemblies, an optical multiplexing assembly and a plurality of main waveguides. The optical waveguide substrate includes a surface and a first reflection inclined surface connected to the surface, and an angle between the surface and the first reflection inclined surface is an acute angle. The plurality of laser assemblies are disposed on the surface of the optical waveguide substrate, and the laser assemblies are configured to emit laser beams towards the surface of the optical waveguide substrate. The optical multiplexing assembly is disposed in the optical waveguide substrate, and the optical multiplexing assembly is configured to combine the laser beams emitted by the plurality of laser assemblies into a laser beam. The plurality of main waveguides are disposed inside the optical waveguide substrate, light inlet ends of the main waveguides face the first reflection inclined surface, and light outlet ends of the main waveguides are communicated with the optical multiplexing assembly. The first reflection inclined surface is configured to reflect the laser beams emitted by the laser assemblies to the main waveguides.

In another aspect, an optical transmission-reception module is provided. The optical transmission-reception module includes: a top cover; a base to which the top cover is fitted to form a cavity; an optical reception device and the optical transmission device according to the above aspect that are encapsulated in the cavity, an isolation rib located between the optical reception device and the optical transmission device, a fixing frame located in the cavity and perpendicular to the isolation rib, and a protrusion extending from an inner wall of the top cover, and located at a side of the optical transmission device and the optical reception device that is away from the fixing frame. The optical reception device is disposed between the isolation rib and a side wall of the base, and the optical transmission device is disposed between the isolation rib and an opposite side wall of the base. An end of the optical reception device and an end of the optical transmission device are in direct contact with the fixing frame, and another end of the optical reception device and another end of the optical transmission device are electrically connected to the circuit board.

In yet another aspect, an optical module is provided. The optical module include: an optical waveguide substrate, comprising a first reflection inclined surface and second reflection inclined surfaces; a plurality of main waveguides and a plurality of secondary waveguides that are all disposed in the optical waveguide substrate, the plurality of secondary waveguides being connected to the plurality of main waveguides in a one-to-one correspondence manner; and a plurality of laser assemblies and a plurality of power detectors located on a surface of the optical waveguide substrate. The plurality of laser assemblies are configured such that light-emitting directions of the plurality of laser assemblies are towards the surface of the optical waveguide substrate. An angle between the surface and the first reflection inclined surface of the optical waveguide substrate is an acute angle, and light inlet ends of the plurality of main waveguides are located below the plurality of laser assemblies. The plurality of laser assemblies are further configured to emit laser beams to the first reflection inclined surface through the surface of the optical waveguide substrate. The plurality of main waveguides are configured to receive reflected laser beams from the first reflection inclined surface. The plurality of secondary waveguides are configured to transmit part of laser beams from corresponding main waveguides to corresponding second reflection inclined surfaces inclined with respect to the surface of the optical waveguide substrate, and the second reflection inclined surfaces are configured to reflect the part of laser beams to corresponding power detectors.

BRIEF DESCRIPTION OF THE DRAWINGS

The accompanying drawings to be used in embodiments will be introduced briefly. However, a person of ordinary skill in the art can obtain other drawings according to these drawings without paying any creative effort.

DETAILED DESCRIPTION

Figure 1:
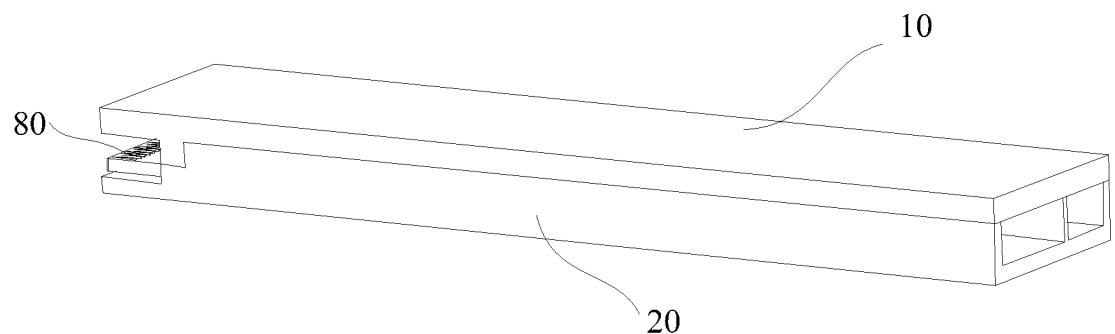
FIG. 1 is a schematic structural diagram of an optical module, in accordance with some embodiments.

Technical solutions in some embodiments of the present disclosure will be described below clearly and completely in combination with the accompanying drawings. However, the described embodiments are merely some but not all embodiments of the present disclosure. All other embodiments obtained based on the embodiments of the present disclosure by a person of ordinary skill in the art shall be included in the protection scope of the present disclosure.

Unless the context requires otherwise, the term "comprise" and other forms thereof such as the third-person singular form "comprises" and the present participle form "comprising" throughout the description and the claims are construed as open and inclusive, i.e., "including, but not limited to". In the description, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined as "first" and "second" may explicitly or implicitly include one or more of the features. In the description of the embodiments of the present disclosure, the term "a plurality of" means two or more unless otherwise specified.

In the description of some embodiments, the terms such as "connected" and its extensions may be used. For example, the term "connected" may be used in the description of some embodiments to indicate that two or more components are in direct physical contact or electric contact with each other. However, the term "connected" may also mean that two or more components are not in direct contact with each other, but still cooperate or interact with each other. The embodiments disclosed herein are not necessarily limited to the contents herein.

The use of the phrase "applicable to" or "configured to" herein means an open and inclusive language, which does not exclude devices that are applicable to or configured to perform additional tasks or steps.

The term "approximately" as used herein includes a stated value and an average value within an acceptable range of deviation of a particular value determined by a person of ordinary skill in the art, considering measurement in question and errors associated with measurement of a particular quantity (i.e., limitations of a measurement system).

In some embodiments, the term "substantially" as used herein includes a structure within an acceptable range, such as 0 to 10%, of deviation of an ideal state of the structure.

An optical module is a device for conversion between optical signals and electrical signals in optical communication. The optical module may be classified as an optical transmission module, an optical reception module or an optical transmission-reception module according to its function. The optical transmission module may generally be referred to as a transmitter optical sub-assembly (TOSA), and is configured to convert electrical signals into optical signals. The optical reception module may generally be referred to as a receiver optical sub-assembly (ROSA), and is configured to convert optical signals into electrical signals. The optical transmission-reception module may generally be referred to as a bi-directional optical sub-assembly (BOSA), and is configured to convert electrical signals into optical signals and convert optical signals into electrical signals.

For example, in a process of optical signal transmission, by adopting a wavelength division multiplexing technology, the optical transmission module multiplexes four paths of optical signals with different wavelengths into a single-mode optical fiber, and the optical reception module demultiplexes the optical signals with the different wavelengths. In order to realize the multiplexing of the optical transmission module and the demultiplexing of the optical reception module, an optical multiplexing device and an optical demultiplexing device may be integrated in the optical transmission module and the optical reception module, respectively.

Figure 2:
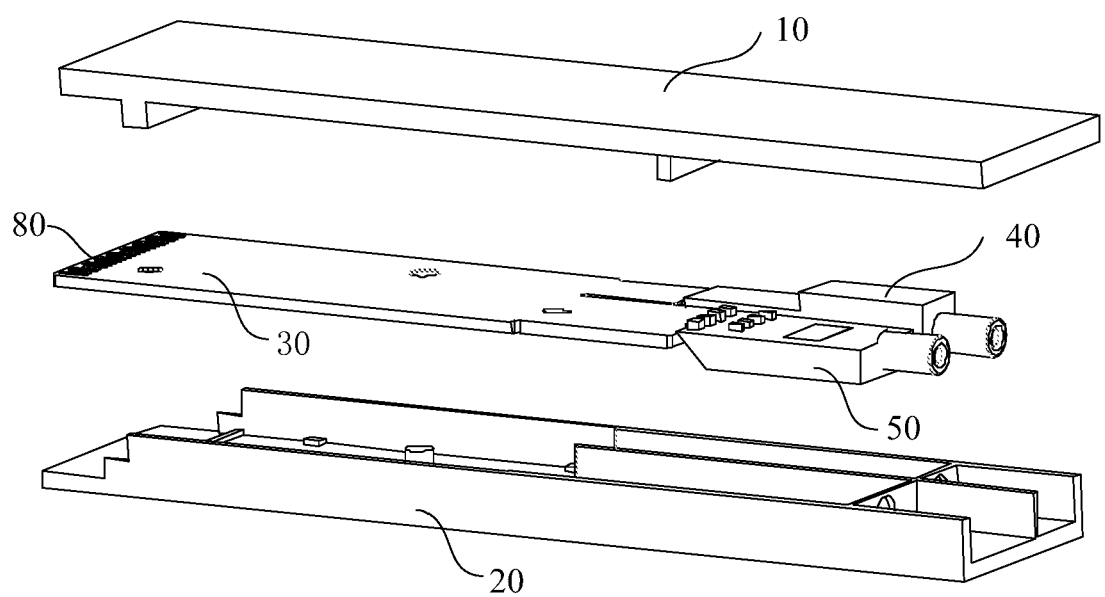
FIG. 2 is an exploded view of an optical module, in accordance with some embodiments.

FIG. 1 is a schematic structural diagram of an optical module in accordance with some embodiments, and FIG. 2 is an exploded view of an optical module in accordance with some embodiments.

Referring to FIGS. 1 and 2, some embodiments provide an optical module, and the optical module includes a top cover 10, a base 20, a circuit board 30, an optical reception device 40 and an optical transmission device 50. The top cover 10 and the base 20 are fitted together to constitute a housing of the optical module. The housing has a cavity therein, and a portion of the circuit board 30, the optical reception device 40 and the optical transmission device 50 are all disposed in the housing. The optical reception device 40 and the optical transmission device 50 are disposed at an edge of the circuit board 30 in a length direction of the circuit board 30, and are both electrically connected to the circuit board 30. Gold fingers 80 configured to electrically communicate with an outside of the optical module are provided on another edge of the circuit board 30 in the length direction of the circuit board 30.

In some other embodiments, the optical module includes only one of the optical reception device 40 and the optical transmission device 50, instead of both of them. It will be noted that, in actual products, the optical module generally includes both the optical reception device and the optical transmission device, and only a few optical modules include only the optical reception device or only the optical transmission device.

Structures of the top cover 10 and the base 20 are not limited herein. For example, the top cover 10 may have the structure shown in FIG. 2, or may have the structure of the top cover 1 shown in FIG. 10. The base 20 may have the structure shown in FIG. 2, or may have the structure of the base 20 shown in FIG. 10.

Figure 3A:
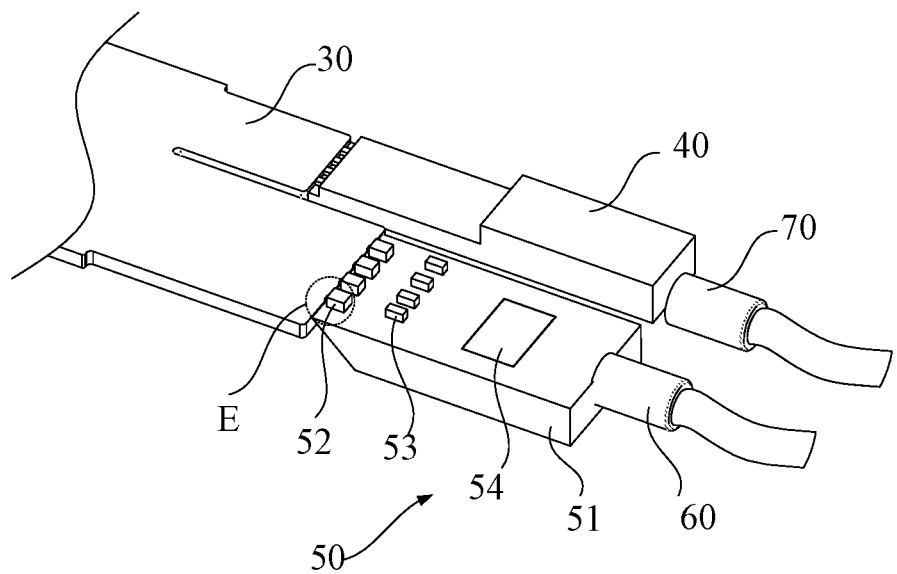
FIG. 3A is a partially structural diagram of an optical module, in accordance with some embodiments.

Referring to FIG. 3A, in a process of optical fiber communication, in order to ensure that data may be transmitted at a high speed over a long distance, in some embodiments, the optical reception device 40 and the optical transmission device 50 are used to realize reception and transmission of light with different wavelengths, respectively. One end of the optical reception device 40 is matched with a first fiber adapter 70, and the first fiber adapter 70 is configured to fix an optical fiber, so that light introduced in the optical fiber may enter the optical reception device 40; the other end of the optical reception device 40 is electrically connected to the circuit board 30, and the optical reception device 40 is configured to convert the optical signal into an electrical signal to realize the conversion from the optical signal to the electrical signal, and transmit the electrical signal into the circuit board 30. One end of the optical transmission device 50 is matched with a second fiber adapter 60, and the second fiber adapter 60 is configured to fix another optical fiber, so that light emitted by the optical transmission device 50 enters the optical fiber; the other end of the optical transmission device 50 is electrically connected to the circuit board 30, and the optical transmission device 50 is configured to receive an electrical signal from the circuit board 30, convert the electrical signal into an optical signal, and transmit the optical signal through the second fiber adapter 60.

A structure of the optical transmission device 50 in the optical module will be described below by way of examples. It will be understood by those skilled in the art that a structure of the optical reception device 40 in the optical module is similar to the structure of the optical transmission device 50, and thus can be referred to the structure of the optical transmission device 50.

In some embodiments, the optical transmission device 50 realizes wavelength multiplexing based on a planar lightwave circuit structure. By combining a planar optical waveguide technology and a precision mounting coupling technology, the optical transmission device 50 realizes higher integration, which may improve an overall stability of the optical module, and improve conversion efficiency between optical signals and electrical signals.

Optical waveguides are dielectric devices that can guide transmission of optical waves therein, and the optical waveguides include integrated optical waveguides and cylindrical optical waveguides. Integrated optical waveguides include planar dielectric optical waveguides and strip dielectric optical waveguides, which are generally a part of optoelectronic integrated devices (e.g., optical modules) and are therefore referred to as integrated optical waveguides. Cylindrical optical waveguides are generally referred to as optical fibers.

Planar lightwave circuit structure or planar optical waveguide technology means that light waves are guided in a single plane. For example, main light waves and secondary light waves, which will be described below, are located in a same plane. Most integrated optical devices, such as optical modulators, optical power splitters, wavelength division multiplexers, optical filters, etc., have planar lightwave circuit structures.

In wavelength division multiplexing (WDM) technology, two or more optical carrier signals with different wavelengths are combined through a multiplexer (combiner) at a transmitting end, the combined optical carrier signals are coupled to a same optical fiber for transmission, and then the optical carrier signals with the different wavelengths are divided through a demultiplexer at a receiving end.

Figure 4:
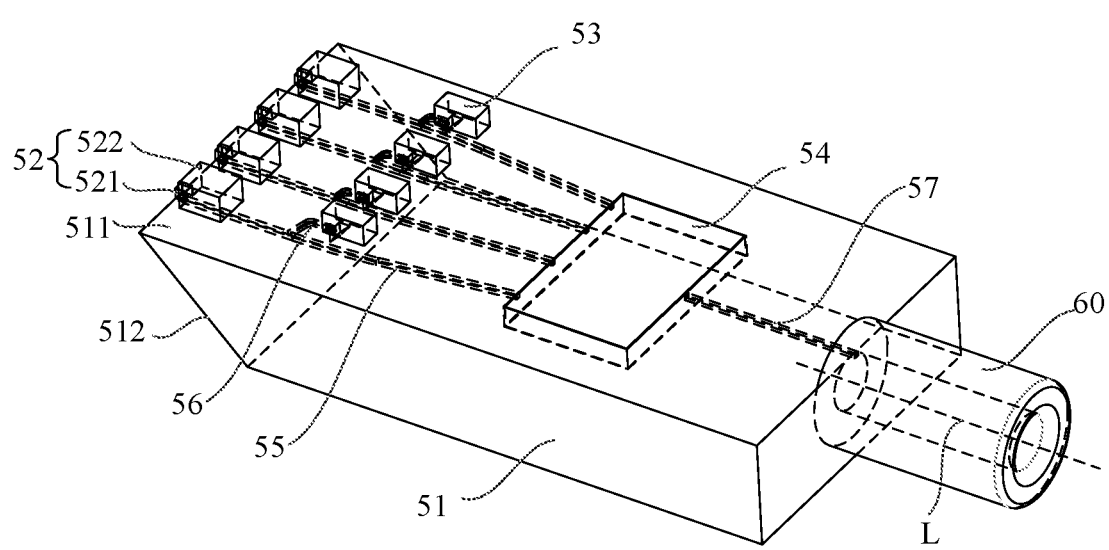
FIG. 4 is a schematic structural diagram of an optical transmission device, in accordance with some embodiments.

In some embodiments, as shown in FIGS. 3A and 4, the optical transmission device 50 includes an optical waveguide substrate 51, a plurality of laser assemblies 52, a plurality of power detectors 53 and an optical multiplexing assembly 54, which are all encapsulated in the housing of the optical module.

In some examples, as shown in FIG. 4, the plurality of laser assemblies 52 and the plurality of power detectors 53 are located on a surface 511 of the optical waveguide substrate 51. The optical multiplexing assembly 54 is disposed in (including inside) the optical waveguide substrate 51, and an upper surface of the optical multiplexing assembly 54 may not protrude from the surface 511 of the optical waveguide substrate 51. As shown in FIGS. 2 and 3A, one end of the optical waveguide substrate 51 is adjacent and connected to the circuit board 30, and the other end of the optical waveguide substrate 51 is connected to the second optical fiber adapter 60 to realize transmission of optical signals.

Figure 5A:
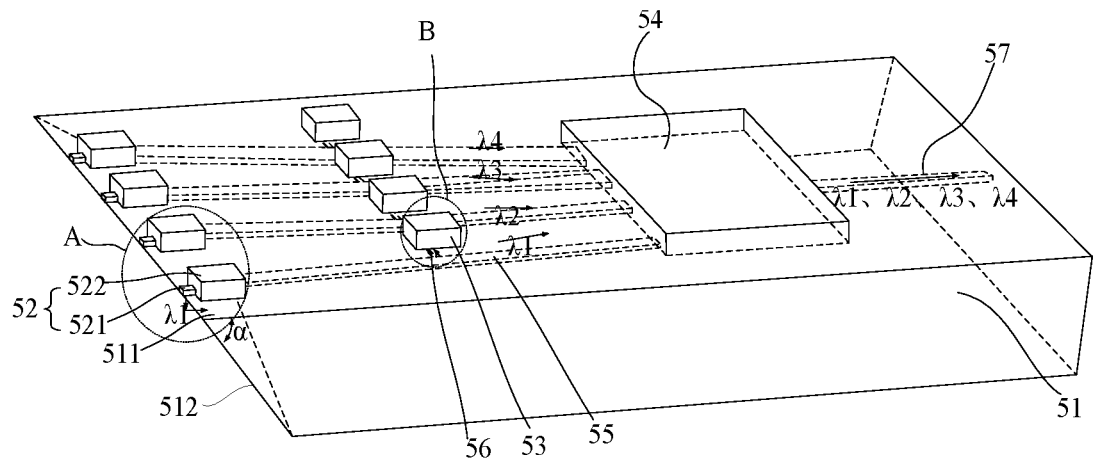
FIG. 5A is an optical path diagram of an optical transmission device, in accordance with some embodiments.
Figure 5B:
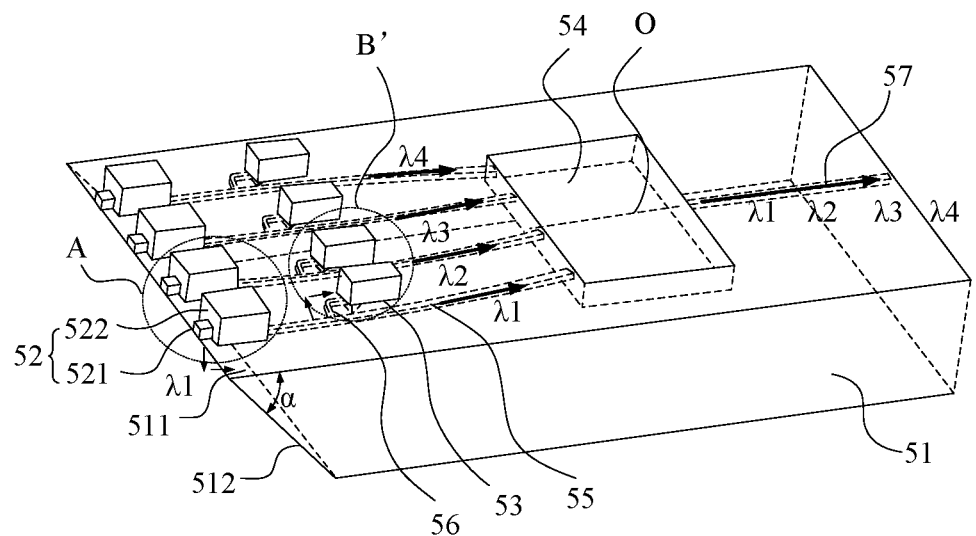
FIG. 5B is an optical path diagram of another optical transmission device, in accordance with some embodiments.

In some examples, as shown in FIG. 4, the laser assembly 52 includes a laser chip 521 that is a common light-emitting chip of an optical module, and the laser chip 521 is configured to emit a laser beam. With better single wavelength characteristic and better wavelength tuning characteristic of the laser beam, the laser chip 521 is an optimal light source for the optical module and even optical fiber transmission. In order to achieve emission of laser beams with different wavelengths, the plurality of laser assemblies 52 capable of emitting the laser beams with different wavelengths, e.g., four laser assemblies 52 shown in FIGS. 4, 5A and 5B, are provided in the optical transmission device 50. The plurality of laser assemblies 52 are arranged side by side on the surface 511 of the optical waveguide substrate 51.

The power detector 53 is configured to receive the laser beam emitted by the laser chip 521 and detect a power of the laser beam. In order to detect powers of laser beams emitted by different laser chips 521, the plurality of power detectors 53, e.g., four power detectors 53 shown in FIGS. 4, 5A and 5B, are provided in the optical transmission device 50. The plurality of power detectors 53 are arranged side by side on the surface 511 of the optical waveguide substrate 51. The plurality of power detectors 53 and the plurality of laser assemblies 52 are in one-to-one correspondence, so that one power detector 53 detects a power of a laser beam emitted by a corresponding laser chip 521.

The optical multiplexing assembly 54 is configured to receive laser beams emitted by the plurality of laser chips 521, and combine the laser beams into a laser beam through a wave-combining process. The combined laser beam is emitted from the second fiber adapter 60 and then enters the optical fiber. The optical multiplexing assembly 54 may be an arrayed waveguide grating (AWG) or a Mach-Zehnder interferometer (M-Z interferometer or MZI), which may transmit laser beams with different wavelengths into a same transmission waveguide.

The AWG and the MZI are generally used as optical multiplexers in wavelength division multiplexing systems to combine light with two or more different wavelengths into a beam of light, thereby improving a transmission efficiency of an optical fiber network.

In the above embodiments, part of the laser beams with different wavelengths emitted by the plurality of laser chips 521 is coupled into the optical multiplexing assembly 54 to be combined into a laser beam, and another part of the laser beams with different wavelengths is coupled into respective power detectors 53 to detect powers of the laser beams. In this case, if the laser assemblies 52 and the power detectors 53 are integrated on the optical waveguide substrate 51, and the optical multiplexing assembly 54 is integrated in the optical waveguide substrate 51, the difficulty in coupling optical paths may be reduced.

In some embodiments, as shown in FIGS. 4, 5A and 5B, the laser assembly 52 further includes a heat sink 522. The heat sink 522 is electrically connected to the laser chip 521. A size of the laser chip 521 is small, for example, the size thereof is in μm level, and thus sizes of electrodes (a cathode and an anode) of the laser chip 521 are also small. The heat sink 522 may function to extend the electrodes of the laser chip 521 and function to dissipate heat from the laser chip 521.

In some embodiments, light-emitting directions of the plurality of laser chips 521 are set to be towards the optical waveguide substrate 51, which may reduce loss of light (consumption of load power occurring somewhere in the transmission system due to insertion of an element or device) during transmission, so that laser beams emitted by the plurality of laser chips 521 may be efficiently combined by the optical multiplexing assembly 54.

Examples are proposed below, in which light-emitting directions of the plurality of laser chips 521 are set to be towards the optical waveguide substrate 51 through the heat sinks 522. Of course, light-emitting directions of the plurality of laser chips 521 may be set to be towards the optical waveguide substrate 51 in other ways.

Figure 3B:
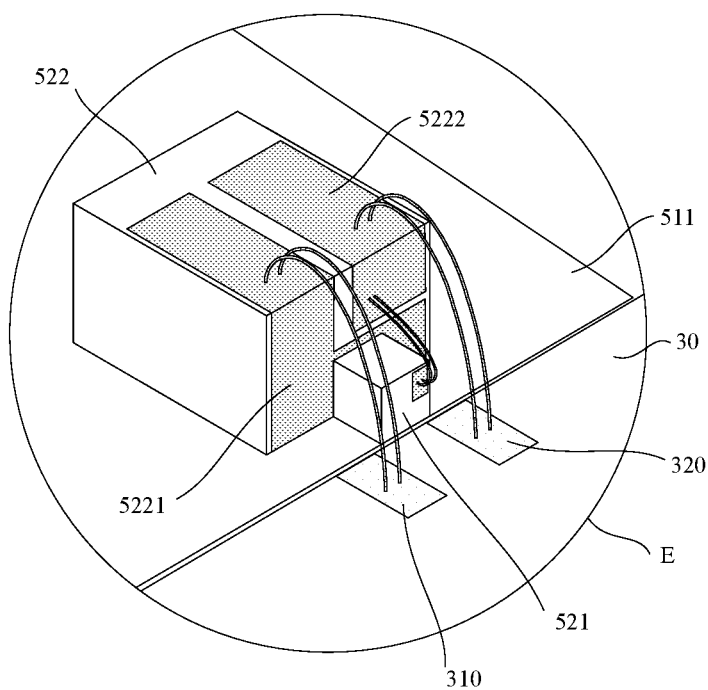
FIG. 3B is a partially enlarged view of the portion E of the optical module shown in FIG. 3A.
Figure 3C:
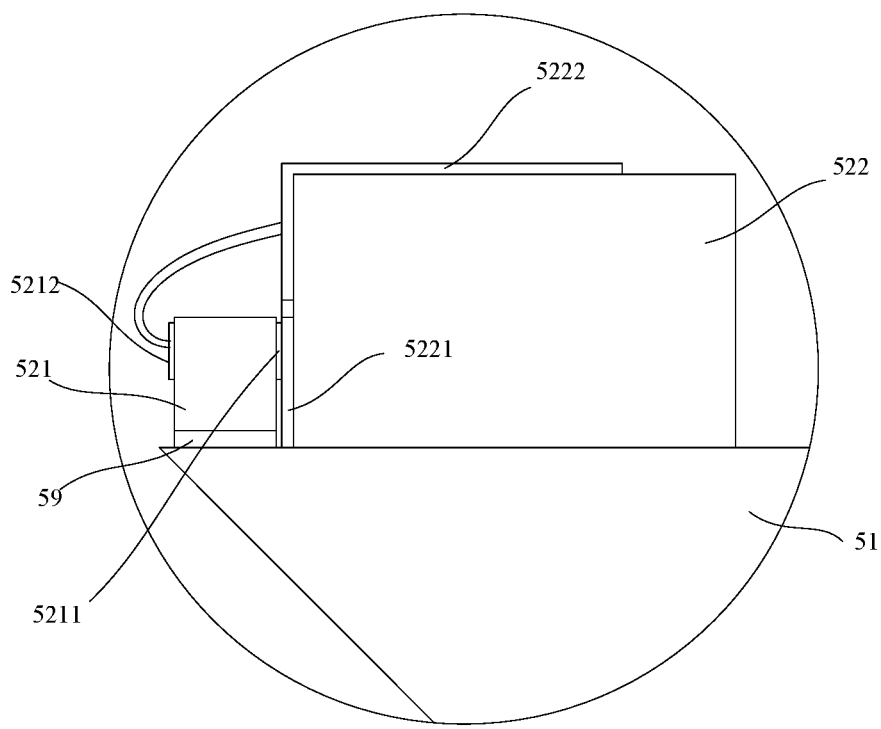
FIG. 3C is a partially enlarged view of the portion E of the optical module shown in FIG. 3A.

In some examples, as shown in FIGS. 3B and 3C, the heat sink 522 is disposed on the surface 511 of the optical waveguide substrate 51. For example, a bottom surface of the heat sink 522 is attached to the surface 511 of the optical waveguide substrate 51. A ground metal layer 5221 is provided on a side wall of the heat sink 522. The laser chip 521 includes a cathode 5211 that is in direct contact with the ground metal layer 5221 and is attached to the side wall of the heat sink 522 through the ground metal layer 5221. The ground metal layer 5221 is electrically connected to a ground circuit 310 of the circuit board 30, so that the cathode 5211 of the laser chip 521 may be electrically connected to the ground circuit 310 through the ground metal layer 5221. A side face of the laser chip 521 (e.g., a lower surface of the laser chip 521) is attached to the optical waveguide substrate 51. The laser chip 521 emits a laser beam through the side face, so that a light-emitting direction of the laser chip 521 is downward, i.e., is towards the surface 511 of the optical waveguide substrate 51.

As shown in FIGS. 3B and 3C, the laser chip 521 further includes an anode 5212 at its another side. A connecting circuit 5222 is provided on at least a surface of the heat sink 522 facing away from the optical waveguide substrate 51, and is electrically connected to the anode 5212 of the laser chip 521. A driving circuit 320 is provided on the circuit board 30 which is also electrically connected to the connecting circuit 5222, so that the driving circuit 320 may transmit an electrical signal to the laser chip 521 through the connecting circuit 5222 to drive the laser chip 521 to emit light.

In some examples, optical matching glue 59 is filled between the laser chip 521 and the optical waveguide substrate 51, and the side face of the laser chip 521 is attached to the surface 511 of the optical waveguide substrate 51 through the optical matching glue 59. Light emitted by the laser chip 521 enters the glue first, and then enters the optical waveguide substrate 51. For example, the optical matching glue 59 is made of epoxy resin.

The refractive index of the optical matching glue 59 is between the refractive index of the laser chip 521 and the refractive index of the optical waveguide substrate 51. For example, the laser chip 521 is provided with a film at its side face. The film may be made of tantalum oxide, and its refractive index is 2.1. In this case, it can also mean that the refractive index of the laser chip 521 is 2.1. The optical waveguide substrate 51 is made of, for example, silicon nitride, and its refractive index is 2.02. The refractive index of the optical matching glue 59 is 2.05. In this case, the optical matching glue 59 reduces a refractive index difference between the laser chip 521 and the optical waveguide substrate 51, which may reduce the loss in an optical transmission process.

In some embodiments, in order to facilitate integration of a plurality of components on the optical waveguide substrate 51 and to ensure efficient transmission of the laser beam emitted by the laser assembly 52, as shown in FIG. 5A, the laser assembly 52 is disposed on an edge of the optical waveguide substrate 51, and the light-emitting direction of the laser chip 521 in the laser assembly 52 is towards the optical waveguide substrate 51. In this case, the laser beam travels in a vertically downward direction as shown in FIG. 5A. Of course, when a relative position of the laser assembly 52 and the optical waveguide substrate 51 is changed, the laser beam may travel in another direction. However, in any case, since the light-emitting direction of the laser chip 521 is towards the optical waveguide substrate 51, the laser beam always travels towards the optical waveguide substrate 51.

The optical multiplexing assembly 54 is located at a position of the optical waveguide substrate 51 away from the plurality of laser chips 521, e.g., at a position relatively close to the right as shown in FIG. 5A. In order to enable the laser beams that are vertically downward and emitted by the plurality of laser chips 521 to be transmitted into the optical multiplexing assembly 54, in some embodiments, as shown in FIG. 5A, an end face of an end of the optical waveguide substrate 51 where the plurality of laser chips 521 are provided is a first reflection inclined surface 512. For example, one side face of an optical waveguide substrate that originally has a rectangular shape is ground into an inclined surface to form a first reflection inclined surface.

In this case, a laser beam emitted by a laser chip 521 travels to the first reflection inclined surface 512 through the surface 511 of the optical waveguide substrate 51, and then is totally reflected by the first reflection inclined surface 512 (the total reflection occurs at an interface between the optical waveguide substrate 51 and air) into the optical waveguide substrate 51. A travel path of the laser beam may be referred to the travel path $\lambda 1$ shown in FIG. 6.

In order to avoid loss of light during transmission to improve a transmission efficiency, in some embodiments, as shown in FIG. 5A, an angle $\alpha$ between the first reflection inclined surface 512 and the surface 511 of the optical waveguide substrate 51 is set to approximately 45 degrees, e.g., between 40 degrees and 50 degrees. The angle $\alpha$ is, for example, 41 degrees, 42 degrees, 43 degrees, 44 degrees, 45 degrees, 46 degrees, 47 degrees, 48 degrees, or 49 degrees.

As shown in FIGS. 4 to 5B, the first reflection inclined surface 512 is inclined towards a position where the second fiber adapter 60 is provided. The laser beams emitted by the plurality of laser chips 521 travel in a direction perpendicular to the surface 511 of the optical waveguide substrate 51, and changes their travel directions after being reflected by the first reflection inclined surface 512. Since the angle $\alpha$ between the first reflection inclined surface 512 and the surface 511 of the optical waveguide substrate 51 is 45 degrees, the laser beams vertically downward may be made to travel in a horizontal direction by the reflection. Therefore, the laser beams travel in the horizontal direction in the optical waveguide substrate 51 towards the optical multiplexing assembly 54, and then are combined by the optical multiplexing assembly 54.

The optical waveguide substrate 51 may be made of silicon, silicon dioxide, silicon nitride, or the like.

In some examples, for the transmissions of the laser beams emitted by the laser chips 521 to the power detectors 53 and the optical multiplexing assembly 54, a plurality of waveguide structures are provided in the optical waveguide substrate 51 for realizing the transmissions. A principle of the waveguide structure is the same as a principle of an optical fiber structure. The waveguide structure includes a waveguide and a medium wrapping the waveguide, and the waveguide and the medium have different refractive indexes, so that the laser beams may be transmitted in the waveguide structure.

In some embodiments, as shown in FIGS. 4 to 7B, a plurality of main waveguides 55 are provided in the optical waveguide substrate 51, and the plurality of main waveguides 55 use the above waveguide structure (including the waveguide and the medium wrapping the waveguide). Each main waveguide 55 corresponds to one laser assembly 52 to realize transmission of the laser beam emitted by the laser assembly 52. A light inlet end of the main waveguide 55 is disposed below the laser assembly 52, and a light outlet end of the main waveguide 55 is communicated with a corresponding light inlet end of the light multiplexing assembly 54. In this way, a laser beam emitted by each laser assembly 52 may vertically enter the light waveguide substrate 51, is reflected by the first reflection inclined surface 512 into the main waveguide 55, travels in the horizontal direction in the main waveguide 55, and then enters the optical multiplexing assembly 54, so that the optical multiplexing assembly 54 may combine the laser beams emitted by the laser assemblies 52. In addition, the optical multiplexing assembly 54 is located inside the optical waveguide substrate 51, which makes the main waveguide 55 transmit the laser beam into the optical multiplexing assembly 54 in a state of maintaining a horizontal arrangement.

In some embodiments, as shown in FIGS. 5B to 7B, the laser assembly 52 and the power detector 53 are located on a same plane, and geometric centers of portions of the first reflection inclined surface 512 facing the light inlet ends of the main waveguides 55, geometric centers P of the main waveguides 55 and a geometric center O of the optical multiplexing assembly 54 are located in a same plane parallel to the surface 511 of the optical waveguide substrate 51, so as to form an optical transmission device 50 for wavelength division multiplexing based on a planar lightwave circuit structure. As a result, the optical transmission device 50 may be more stable and may be easy to assemble.

In some embodiments, as shown in FIGS. 4 to 5B, a transmission waveguide 57 is also provided in the optical waveguide substrate 51. One end of the transmission waveguide 57 is communicated with a light outlet end of the optical multiplexing assembly 54, and the other end of the transmission waveguide 57 is communicated with the second fiber adapter 60.

In some examples, in order to avoid excessive interface reflection and loss of light, the transmission waveguide 57 is arranged horizontally in a case where the optical waveguide substrate 51 is placed horizontally (i.e., the surface 511 of the optical waveguide substrate 51 is parallel to a horizontal plane). In this case, the optical multiplexing assembly 54 receives laser beams transmitted by the main waveguides 55, and combines the laser beams into a laser beam. The transmission waveguide 57 transmits the combined laser beam to the second fiber adapter 60, which then transmits the combined laser beam into the optical fiber.

Figure 6:
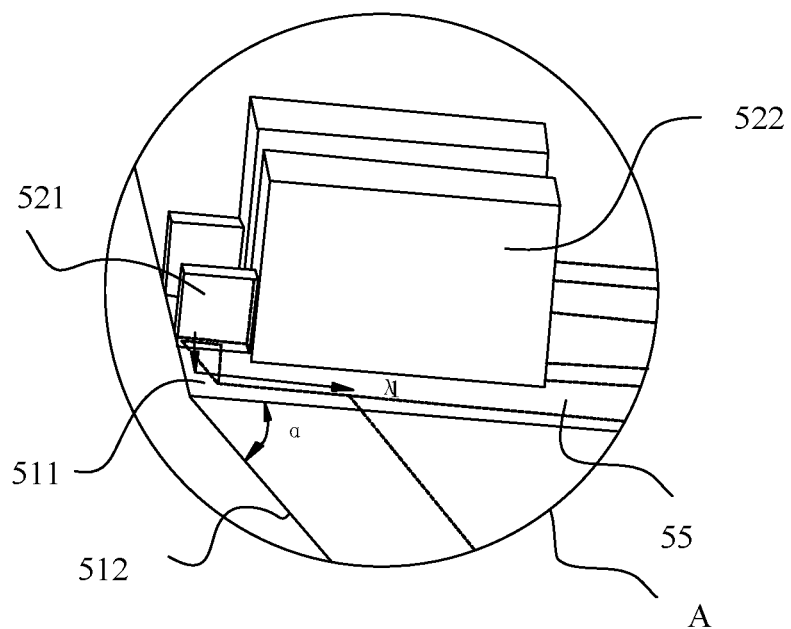
FIG. 6 is a partially enlarged view of the portion A of the laser assembly shown in FIGS. 5A and 5B.

As shown in FIGS. 5A and 6, in an example where the optical transmission device 50 includes four laser assemblies 52, a first laser chip 521 emits a laser beam $\lambda 1$ in a direction towards the optical waveguide substrate 51. The laser beam $\lambda 1$ enters the main waveguide 55 after being reflected by the first reflection inclined surface 512, then travels in the main waveguide 55 in the horizontal direction, and then enters the optical multiplexing assembly 54. Similarly, laser beams $\lambda 2$, $\lambda 3$ and $\lambda 4$ emitted by remaining laser chips 521 enter the optical multiplexing assembly 54 according to the above transmission process. The optical multiplexing assembly 54 combines the laser beams $\lambda 1$, $\lambda 2$, $\lambda 3$ and $\lambda 4$, and outputs the combined laser beam through the transmission waveguide 57. Then the combined laser beam enters the optical fiber after passing through the second fiber adapter 60.

As shown in FIGS. 5A and 6, in this example, the optical transmission device 50 further includes four power detectors 53 disposed on the surface 511 of the optical waveguide substrate 51, and located between corresponding laser assemblies 52 and the optical multiplexing assembly 54, respectively, so that one power detector 53 is used to detect a power of a laser beam emitted by a corresponding laser assembly 52.

Figure 7A:
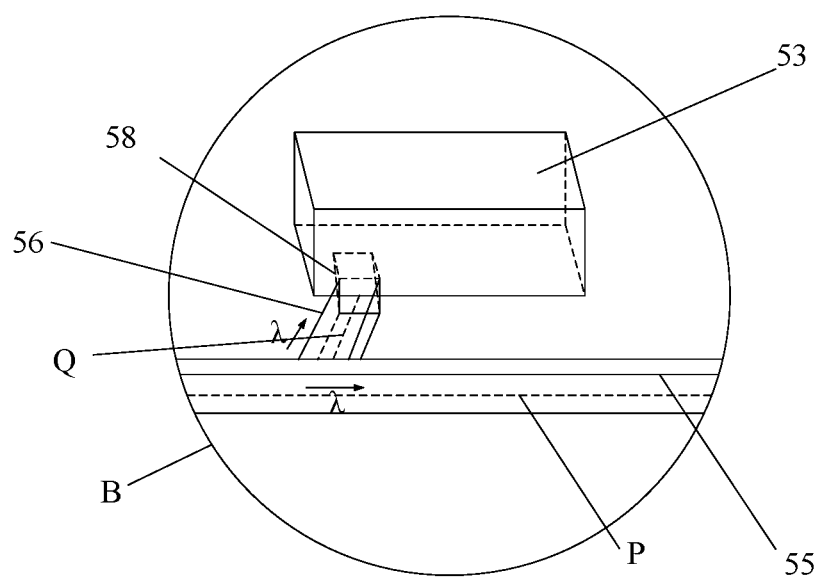
FIG. 7A is a partially enlarged view of the portion B of the laser assembly shown in FIG. 5A.
Figure 7B:
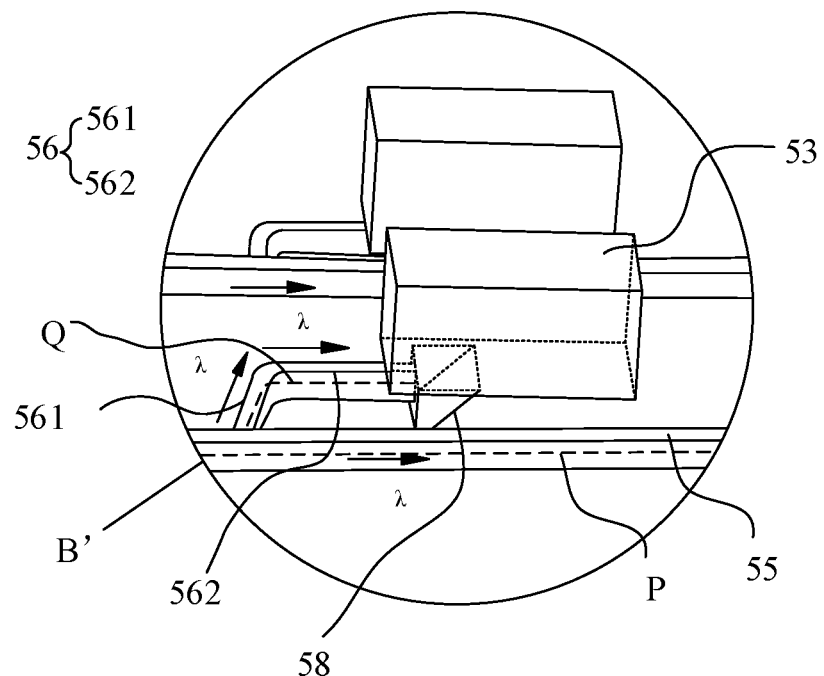
FIG. 7B is a partially enlarged view of the portion B' of the laser assembly shown in FIG. 5B.

In some embodiments, as shown in FIGS. 5A, 7A and 7B, a plurality of secondary waveguides 56 are provided in the optical waveguide substrate 51. One end of each secondary waveguide 56 is communicated with a corresponding main waveguide 55, and the other end of the secondary waveguide 56 is connected to a corresponding power detector 53. The plurality of secondary waveguides 56 use the above waveguide structure (including the waveguide and the medium wrapping the waveguide). A laser beam transmitted in the main waveguide 55 is branched at a position where the main waveguide 55 is communicated with the secondary waveguide 56, so that a part of the laser beam is continuously transmitted in the main waveguide 55 and then enters the optical multiplexing assembly 54; and another part of the laser beam enters the secondary waveguide 56 and then enters the power detector 53 to facilitate the power detector 53 to perform power detection.

A power of light entering the power detector 53 is generally set to ¹⁄₁₀ of a total power of the light emitted by the laser chip 521, that is, the light entering the secondary waveguide 56 is ¹⁄₁₀ of the light transmitted in the main waveguide 55, and the power of the light entering the power detector 53 is much less than the total power of the light emitted by the laser chip 521.

When a plurality of laser assemblies 52 are used for optical fiber transmission, one power detector 53 is provided between the optical multiplexing assembly 54 and each laser assembly 52. Each power detector 53 is communicated with a corresponding main waveguide 55 through a secondary waveguide 56, so that one laser assembly 52, one main waveguide 55, one secondary waveguide 56 and one power detector 53 form a coupled optical path.

In some embodiments, as shown in FIGS. 7A to 7B, in order to facilitate the laser beam transmitted by the secondary waveguide 56 to enter the power detector 53, a surface of the power detector 53 in direct contact with the surface 511 of the optical waveguide substrate 51 is set as a photosensitive surface. A groove is provided in the surface 511 of the optical waveguide substrate 51, and a surface of the groove facing the light outlet end of the secondary waveguide 56 is set to be an inclined surface to form a second reflection inclined surface 58.

Figure 8:
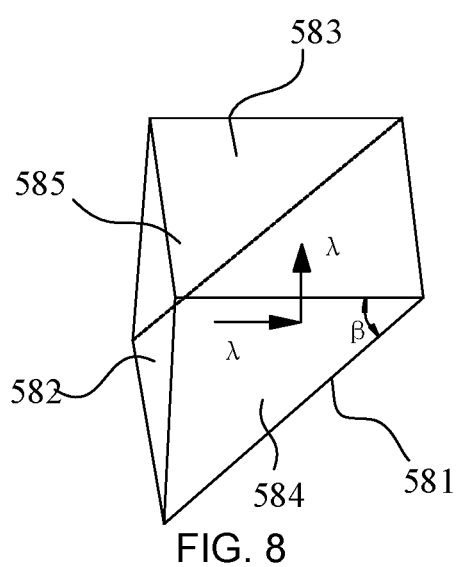
FIG. 8 is a reflective optical path diagram of a second reflection inclined surface, in accordance with some embodiments.

In some examples, as shown in FIGS. 7A to 7B, an inclined direction of the second reflection inclined surface 58 is towards a position where the laser assembly 52 is located. For example, as shown in FIGS. 7B and 8, the second reflection inclined surface 58 is disposed below the power detector 53, and an angle β between the second reflection inclined surface 58 and the photosensitive surface of the power detector 53 may be set to approximately 45 degrees, e.g., in a range between 40 degrees and 50 degrees. The angle β is, for example, 41 degrees, 42 degrees, 43 degrees, 44 degrees, 45 degrees, 46 degrees, 47 degrees, 48 degrees, or 49 degrees.

In the above embodiments, the second reflection inclined surface 58 is set to be inclined towards the secondary waveguide 56, so that after the laser beam output horizontally from the light outlet end of the secondary waveguide 56 reaches the second reflection inclined surface 58, the laser beam is reflected by the second reflection inclined surface 58 upwards, and then enters the power detector 53 through the photosensitive surface. A reflection path of the laser beam on the second reflection inclined surface 58 may be referred to the optical path shown in FIG. 8.

In some examples, as shown in FIG. 8, the groove provided in the optical waveguide substrate 51 is a wedge-shaped groove, and the wedge-shaped groove is communicated with the light outlet end of the secondary waveguide 56 and is located below the power detector 53. The wedge-shaped groove may include a rectangular opening 583 facing the power detector 53 and four walls, i.e., two triangular walls 584 and 585 opposite to each other, and a first rectangular wall 582 and a second rectangular wall 581 arranged at an included angle. The four walls enclose the rectangular opening 583.

For example, a cross-sectional shape of the wedge-shaped groove is an isosceles right triangle, that is, the first rectangular wall 582 is perpendicular to the rectangular opening 583 (i.e., the surface 511 of the optical waveguide substrate 51). When the optical waveguide substrate 51 is horizontally placed, a length of the first rectangular wall 582 in a vertical direction is the same as a length of the rectangular opening 583 in the horizontal direction. The rectangular opening 583 is opposite to the photosensitive surface of the power detector 53. The first rectangular wall 582 faces the secondary waveguide 56 and is communicated with the light outlet end of the secondary waveguide 56. The second rectangular wall 581 of the wedge-shaped groove is the second reflection inclined surface 58, and the second reflection inclined surface 58 is inclined towards the light outlet end of the secondary waveguide 56.

In some embodiments, as shown in FIGS. 5B to 7B, geometric centers P of the main waveguides 55, geometric centers Q of the secondary waveguides 56, and a geometric center O of the optical multiplexing assembly 54 are located in a same plane parallel to the surface 511 of the optical waveguide substrate 51, so as to form an optical transmission device 50 for wavelength division multiplexing based on a planar lightwave circuit structure. As a result, the optical transmission device 50 may be more stable and may be easy to assemble.

In this case, as shown in FIGS. 7B and 8, after passing through the light outlet end of the secondary waveguide 56, the laser beam A travels to the second rectangular wall 581, i.e., the second reflection inclined surface 58, and is reflected by the second reflection inclined surface 58 upwards. Then, the photosensitive surface of the power detector 53 receives the reflected laser beam to detect the power of the laser beam.

In some examples, in order to avoid insertion loss of the light during transmission, as shown in FIG. 7A, the secondary waveguide 56 is perpendicular to the main waveguide 55. In addition, in order to avoid multi-interface reflection of light inside the secondary waveguide 56 and further avoid loss, in some examples, in the case where the optical waveguide substrate 51 is horizontally placed, the secondary waveguide 56 is arranged horizontally. In this case, when the laser beam emitted by the laser chip 521 passes through the main waveguide 55, a part of the laser beam enters the secondary waveguide 56, and reaches the second reflection inclined surface 58. After being reflected by the second reflection inclined surface 58, the part of the laser beam vertically and upwardly enters the power detector 53. In this process, insertion loss may not occur, and the transmission efficiency of the light may be high.

In some examples, as shown in FIG. 7A, the secondary waveguide 56 has a same linear structure as the main waveguide 55, but a length of the secondary waveguide 56 is shorter than a length of the main waveguide 55. The secondary waveguide 56 maintains a perpendicular relationship with the main waveguide 55, and a part of the laser beam is split from the laser beam transmitted in the main waveguide 55 at an intersection of the main waveguide 55 and the secondary waveguide 56, enters the secondary waveguide 56, travels in the secondary waveguide 56 in the horizontal direction and is not reflected, reaches the second reflection inclined surface 58, and is reflected to the power detector 53 by the second reflection inclined surface 58.

In some other examples, as shown in FIG. 7B, the secondary waveguide 56 has an L-shaped structure. The secondary waveguide 56 includes a first waveguide section 561 and a second waveguide section 562 that are perpendicular to each other. An extension direction of the first waveguide section 561 is perpendicular to an extension direction of the main waveguide 55, and an extension direction of the second waveguide section 562 is substantially parallel to the extension direction of the main waveguide 55. A light outlet end of the second waveguide section 562 is located below the power detector 53, and faces the second reflection inclined surface 58. In this way, after a part of the laser beam in the main waveguide 55 enters the secondary waveguide 56, the part of the laser beam is reflected once in the secondary waveguide 56, and a position of the reflection is a position where the first waveguide section 561 and the second waveguide section 562 are communicated. In this case, loss of light may be avoided and the stability of light transmission may be improved.

It will be seen that, in the optical module provided by some embodiments of the present disclosure, the laser chip 521 in the laser assembly 52 emits a laser beam towards the optical waveguide substrate 51. The first reflection inclined surface 512 of the optical waveguide substrate 51 reflects the laser beam into the main waveguide 55. The main waveguide 55 transmits a part of the laser beam to the optical multiplexing assembly 54, and together with the secondary waveguide 56, transmits another part of the laser beam to the second reflection inclined surface 58. The second reflection inclined surface 58 reflects the another part of the laser beam into the power detector 53. The power detector 53 detects the power of the another part of the laser beam. The optical multiplexing assembly 54 combines laser beams emitted by the laser assemblies 52, and transmits the combined laser beam to the second fiber adapter 60 through the transmission waveguide 57. Then the laser beam enters the optical fiber.

Figure 9:
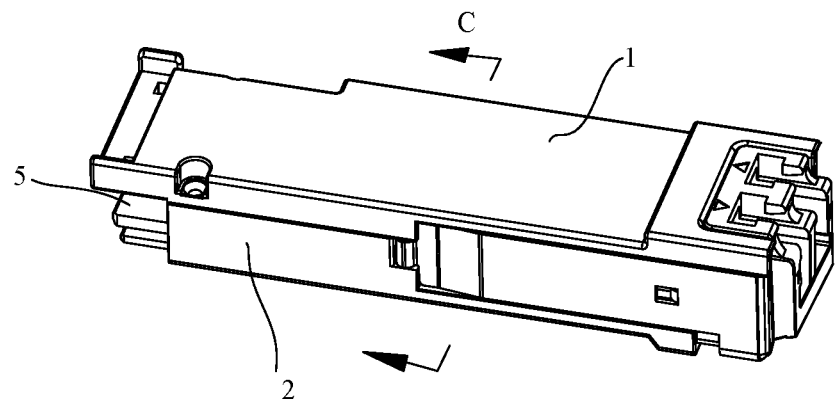
FIG. 9 is a schematic structural diagram of another optical module, in accordance with some embodiments of the present disclosure.
Figure 10:
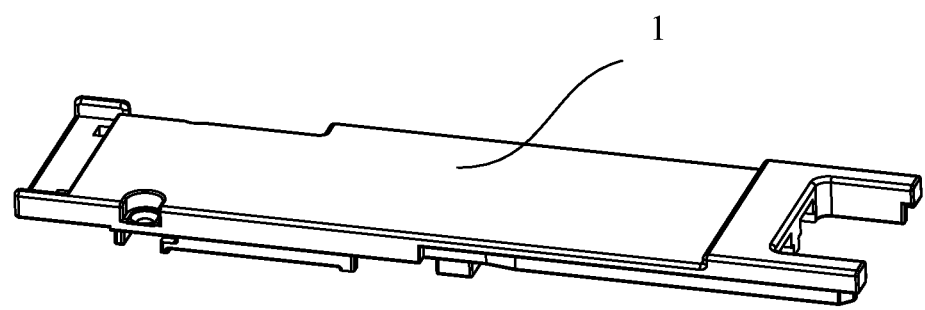
FIG. 10 is a schematic exploded view illustrating a partial structure of another optical module, in accordance with some embodiments.
Figure 10:
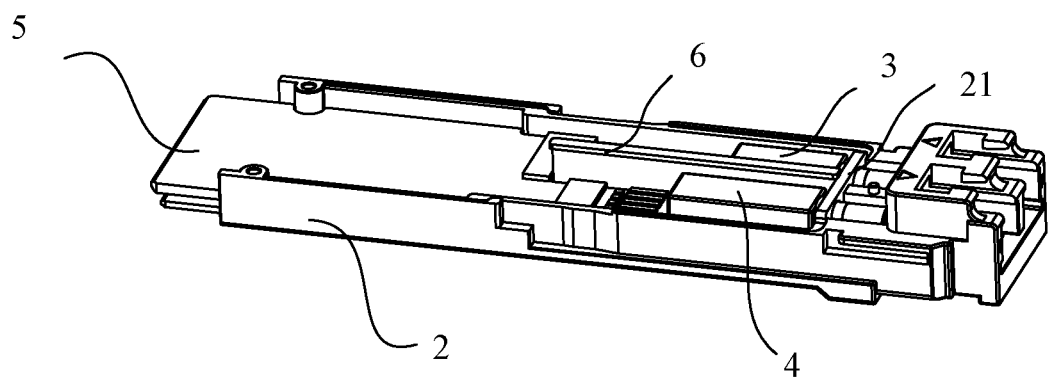

As will be seen from the above, the embodiments of the present disclosure provide the optical module including the top cover 10 and the base 20 to which the top cover 10 is fastened to form a cavity as shown in FIGS. 1 and 2. The optical reception device 40 and the optical transmission device 50 are encapsulated in the cavity. However, the structure of the optical module is not limited thereto herein. For example, the optical module may include the top cover 1 and the base 2 as shown in FIGS. 9 and 10, and an optical reception device 3 and an optical transmission device 4 are encapsulated in a cavity formed by the top cover 1 and the base 2. The optical transmission device 50 (or the optical transmission device 4) includes an optical waveguide substrate 51, laser assemblies 52 and power detectors 53. The laser assemblies 52 and the power detectors 53 are integrated on the surface 511 of the optical waveguide substrate 51 by using a precision mounting coupling technology, and a light-emitting direction of the laser assembly 52 and a photosensitive surface of the power detector 53 both face the optical waveguide substrate 51. By combining the planar optical waveguide technology, geometric centers of a portion of the first reflection inclined surface 512 corresponding to a light inlet end of the main waveguide 55, the main waveguide 55, the secondary waveguide 56, and a portion of the second reflection inclined surface 58 corresponding to the light outlet end of the secondary waveguide 56 are made to be located in a same plane, and the secondary waveguide 56 is connected to the main waveguide 55. In this case, the laser assembly 52 emits a laser beam in a direction perpendicular to the optical waveguide substrate 51. The first reflection inclined surface 512 reflects the laser beam into the main waveguide 55 without insertion loss of light. The secondary waveguide 56 transmits a part of the laser beam that is split from the laser beam in the main waveguide 55 to the second reflection inclined surface 58, and the second reflection inclined surface 58 reflects the part of the laser beam upwards into the power detector 53. It will be seen that, by combining the planar optical waveguide technology and the precision mounting coupling technology, the optical module may achieve higher integration and easy assembly, which may improve a transmission efficiency of the optical module, and improve the overall stability.

It will be noted that, although the above description only introduces examples of a structure of the optical transmission device 50, a structure of the optical reception device 40 (or the optical reception device 3) may also be obtained by these examples. That is, the optical reception device may include an optical waveguide substrate, a demultiplexer in the optical waveguide substrate, and optical waveguides connected to the demultiplexer.

In some embodiments, the laser beams may be transmitted through the optical waveguide substrate 51, which may reduce the insertion loss of light, improve the transmission efficiency of the optical module and the overall stability.

In some other embodiments, another optical module is provided, so as to reduce crosstalk, enable the whole optical module to adapt to high-speed signal transmission, further improve the transmission efficiency of the optical module and improve the overall stability.

FIG. 9 is a schematic structural diagram of an optical module in accordance with some embodiments, and FIG. 10 is an exploded view of a partial structure of an optical module in accordance with some embodiments.

Referring to FIGS. 9 and 10, the optical module includes a top cover 1 and a base 2. The top cover 1 is fitted to the base 2 to form a housing of the optical module. The housing has a hollow structure, and thus has a cavity therein. An optical reception device 3 and an optical transmission device 4 are encapsulated in the cavity, and a circuit board 5 is partially encapsulated in the cavity. The optical reception device 3 and the optical transmission device 4 are both electrically connected to the circuit board 5, and electrically connected to components on the circuit board 5. The optical reception device 3 and the optical transmission device 4 are both disposed at an edge of the circuit board 5 in a length direction thereof.

Figure 11:
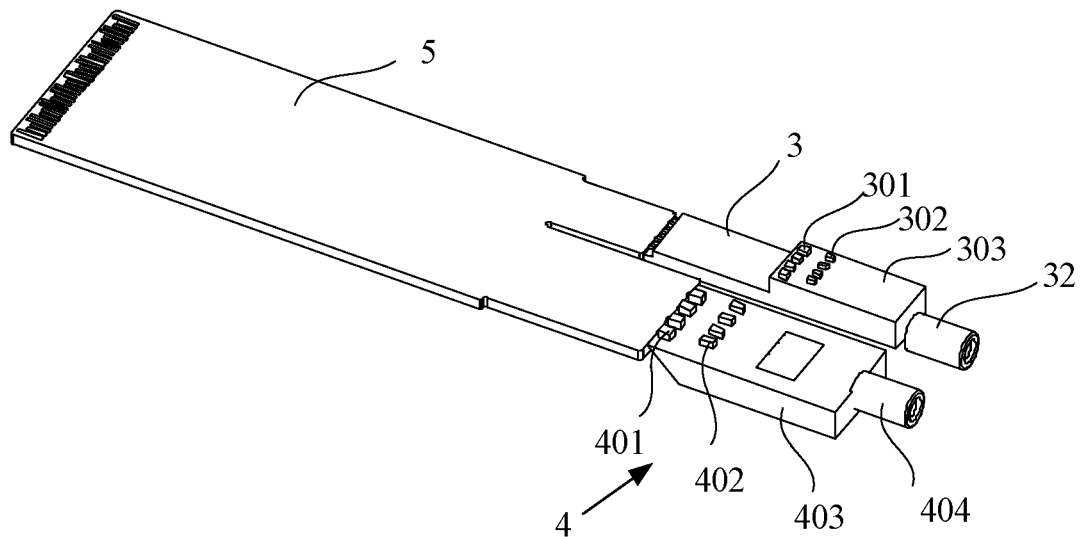
FIG. 11 is a schematic diagram illustrating structures of an optical reception device and an optical transmission device, in accordance with some embodiments.

In some embodiments, as shown in FIG. 11, the optical reception device 3 includes detectors 301, detector-related electric devices 302 and a receiving optical waveguide 303, and the optical transmission device 4 includes lasers 401, laser-related electric devices 402 and a transmitting optical waveguide 403.

In some embodiments, as shown in FIGS. 10 and 11, in the optical module, the detectors 301 and the detector-related electric devices 302 are not shielded and encapsulated separately, and the lasers 401 and the laser-related electric devices 402 are also not shielded and encapsulated separately. The detectors 301 and the detector-related electric devices 302 are located on an outer surface of the receiving optical waveguide 303, and the lasers 401 and the laser-related electric devices 402 are located on an outer surface of the transmitting optical waveguide 403. After the top cover 1 and the base 2 of the optical module are separated, the lasers 401, the detectors 301 and other devices are exposed to the air or a same space. In this case, the top cover 1 and the base 2 of the optical module are designed to have an isolation structure, which may not only realize electromagnetic shielding isolation between the inside and the outside of the optical module, but may also realize electromagnetic shielding isolation between the optical reception device 3 and the optical transmission device 4 inside the optical module.

Figure 12:
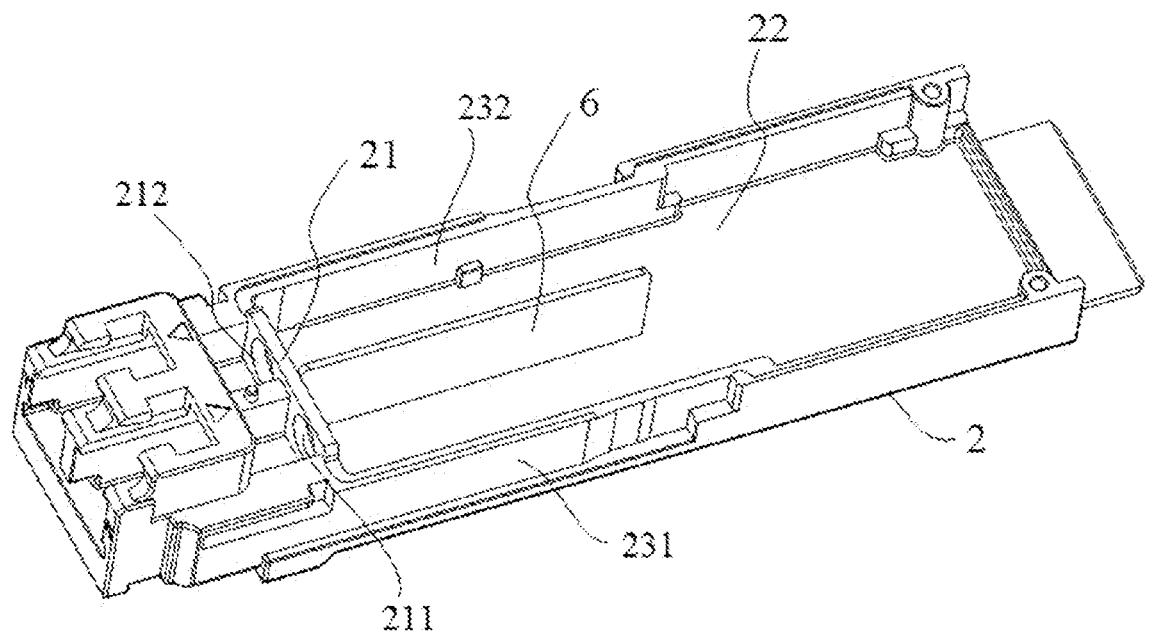
FIG. 12 is a schematic structural diagram of a base of an optical module, in accordance with some embodiments.

In some embodiments, as shown in FIGS. 10 and 12, the optical module further includes an isolation rib 6 disposed between the optical reception device 3 and the optical transmission device 4. In this way, a right side of the optical reception device 3 and a left side of the optical transmission device 4 are shielded by the isolation rib 6, a left side of the optical reception device 3 is shielded by a side wall 231 of the base 2, and a right side of the optical transmission device 4 is shielded by an opposite other side wall 232 of the base 2, so as to achieve isolation between the optical reception device 3 and the optical transmission device 4.

In some examples, in order to ensure stability and shielding performance of the isolation rib 6, as shown in FIG. 12, the isolation rib 6 may be fixed on the bottom 22 of the base 2, or the isolation rib 6 and the bottom 22 of the base 2 may be one integral structure.

Figure 13:
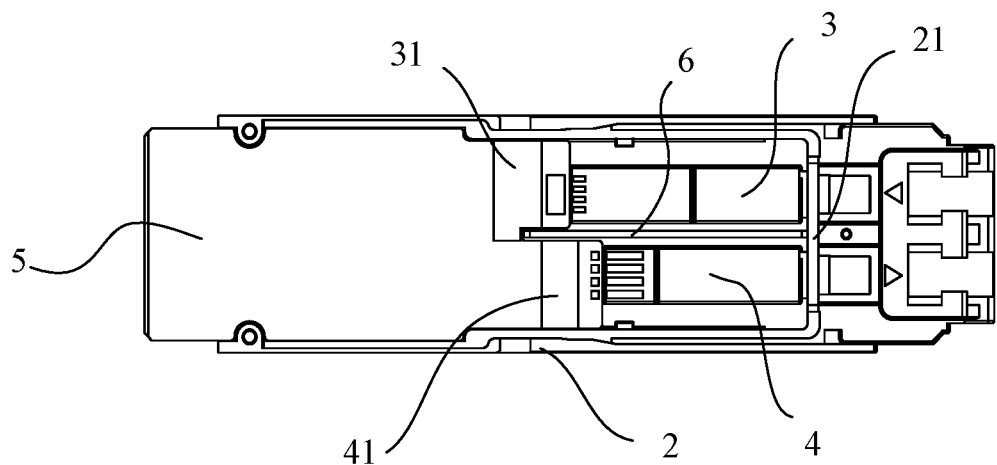
FIG. 13 is a top view of a base, in accordance with some embodiments.

In some embodiments, as shown in FIGS. 12 and 13, the optical module further includes a fixing frame 21 disposed on the bottom 22. The fixing frame 21 is arranged in a direction perpendicular to a length direction of the base 2, and is used to mount the optical reception device 3 and the optical transmission device 4. The fixing frame 21 is provided with two through holes (i.e., a first through hole 211 and a second through hole 212) in the direction perpendicular to the length direction of the base 2.

As shown in FIG. 12, in some examples, an end of the isolation rib 6 is connected to the fixing frame 21, and the isolation rib 6 is perpendicular to the fixing frame 21.

The optical fiber adapter 32 is located at a front end of the optical reception device 3 (i.e., an end of the optical reception device 3 away from the circuit board 5), and the optical fiber adapter 32 penetrates through the first through hole 211, and are tightly fitted to first through hole 211. The optical fiber adapter 404 is located at a front end of the optical transmission device 4 (i.e., an end of the optical transmission device 4 away from the circuit board 5), penetrates through the second through hole 212, and is tightly fitted to the second through hole 212. The optical reception device 3 and the optical transmission device 4 are mounted side by side in the cavity by the fixing frame 21, and front ends of the optical reception device 3 and the optical transmission device 4 are shielded by the fixing frame 21.

Figure 15:
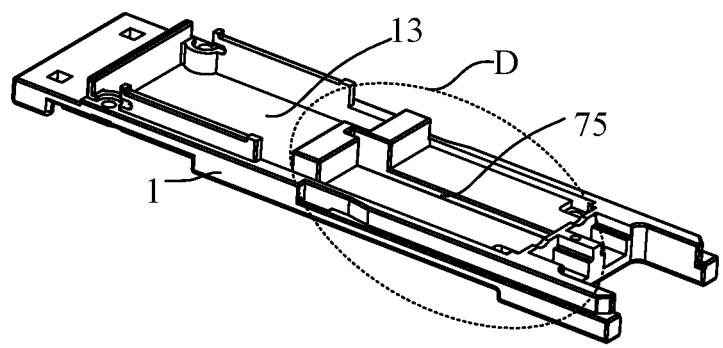
FIG. 15 is a schematic structural diagram of a top cover, in accordance with some embodiments.
Figure 17:
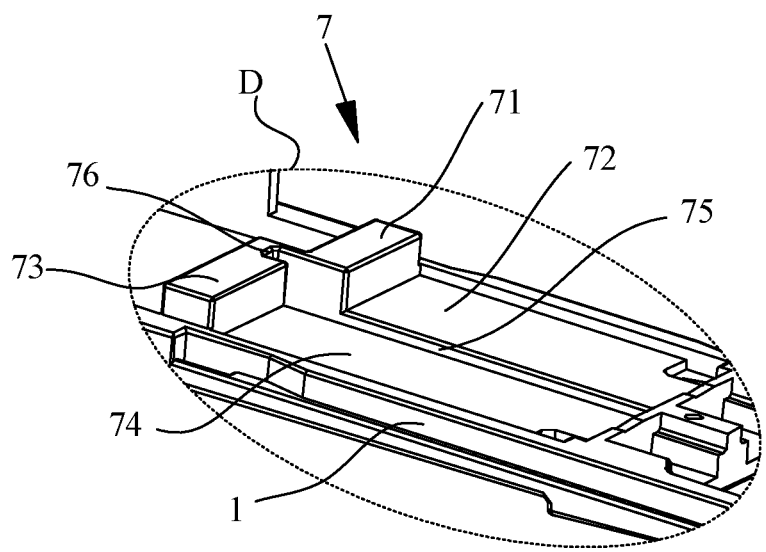
FIG. 17 is a partially enlarged view of the portion D of the top cover of the optical module shown in FIG. 15.
Figure 19:
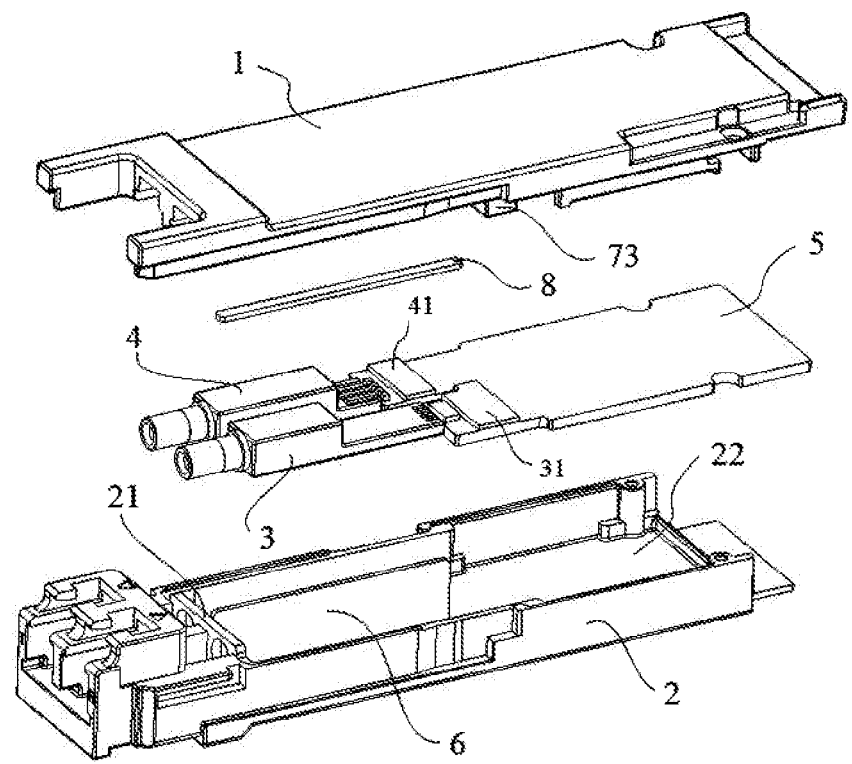
FIG. 19 is an exploded view of an optical module, in accordance with some embodiments.

In some embodiments, in order to shield and isolate the two optical devices by using the top cover 1 and the base 2, in a case where the top cover 1 is at the top and the base 2 is at the bottom, as shown in FIGS. 15 and 17, a protrusion 7 extending down is provided on an inner wall of the top cover 1. As shown in FIGS. 10 and 19, after the top cover 1 is fitted to the base 2, the protrusion 7 is located at an upper part of the circuit board 5. In addition, the protrusion 7 is located at rear ends (i.e., ends proximate to the circuit board 5) of the optical reception device 3 and optical transmission device 4, so that the top cover 1, the protrusion 7 and the base 2 form a closure.

As shown in FIG. 10, a space above the optical reception device 3 and a space above the optical transmission device 4 are shielded by the top cover 1, a space below the optical reception device 3 and a space below the optical transmission device 4 are shielded by the bottom 22 of the base 2. The protrusion 7 abuts against the circuit board 5 to form a shield against the rear end of the optical reception device 3 and the rear end of the optical transmission device 4.

A thickness of the isolation rib 6 may be determined according to a distance between the optical reception device 3 and the optical transmission device 4, a length of the isolation rib 6 may be determined according to lengths of the optical reception device 3 and the optical transmission device 4, and a height of the isolation rib 6 may be set according to a distance between the bottom 22 of the base 2 and the top cover 1. In order to achieve better shielding effect, the isolation rib 6, the top cover 1, the base 2 and the fixing frame 21 may all be made of a metal material. The isolation rib 6 may be made of a ferrous material, and the ferrous material has a good characteristic of isolating electromagnetic waves.

The isolation rib 6 is located in the cavity. In order to ensure the isolation effect of the isolation rib 6, the height of the isolation rib 6 needs to be matched with the distance between the top cover 1 and the base 2 in a case where the top cover 1 is fastened to the base 2. In a case where the top cover 1 is fastened to the base 2, if the height of the isolation rib 6 is greater than the distance, the top cover 1 and the base 2 cannot be fastened together, or tightness is poor. If the height of the isolation rib 6 is less than the distance, that is, the isolation rib 6 is lower than a top of the base 2, it is easy to cause a gap between the isolation rib 6 and the top cover 1. The electromagnetic waves radiated outwards by the optical reception device 3 and the optical transmission device 4 may generate crosstalk through the gap, resulting in a poor isolation effect. Therefore, in some examples, in a case where the top cover 1 is fastened to the base 2, the height of the isolation rib 6 is set such that a top of the isolation rib 6 is attached to an inner wall of the top cover 1 and there is no gap between the isolation rib 6 and the top cover 1, which may have a good isolation effect.

In some embodiments, as shown in FIG. 12, the isolation rib 6 may have a flat plate-shaped structure. However, the structure of the isolation rib 6 is not limited thereto. For example, the isolation rib 6 may also have a wavy curved plate-shaped structure according to a space in the cavity and external structures of the optical reception device 3 and the optical transmission device 4.

As shown in FIG. 12, the isolation rib 6 with the flat plate-shaped structure is perpendicularly fixed to the bottom 22 of the base 2. An end of the isolation rib 6 is perpendicularly fixed to the fixing frame 21, and a connecting point of the isolation rib 6 and the fixing frame 21 is located between two through holes in the fixing frame 21. In a case where the top cover 1 is fastened to the base 2, the flat plate-shaped isolation rib 6, the fixing frame 21, the two side walls 231 and 232 of the base 2 and the downward protrusion 7 on the top cover 1 form two shielding cavities, which are respectively used to shield the electromagnetic waves generated by the optical reception device 3 and the optical transmission device 4, so as to achieve the isolation between the optical reception device 3 and the optical transmission device 4.

Figure 14:
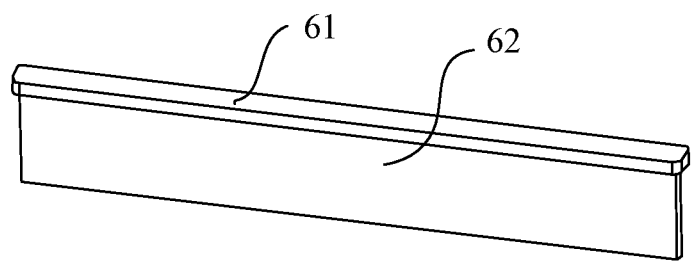
FIG. 14 is a schematic structural diagram of an isolation rib, in accordance with some embodiments.

In some embodiments, in order to improve the stability and the isolation effect of the isolation rib 6, the isolation rib 6 may also have the structure as shown in FIG. 14. Referring to FIG. 14, the isolation rib 6 includes an isolation plate 62 and a support plate 61 located on a top end of the isolation plate 62. A thickness of the support plate 61 is greater than a thickness of the isolation plate 62. Both a thickness direction of the support plate 61 and a thickness direction of the isolation plate 62 are the same as a thickness direction of the isolation rib 6. In this way, a contact area between the isolation rib 6 and the inner wall of the top cover 1 may be increased. Therefore, in a case where the top cover 1 is fasten to the base 2, the top cover 1 may be in close contact with the support plate 61, and stability of the isolation plate 62 may be improved through the support plate 61, which may avoid affecting the isolation effect due to a gap generated by shaking of the isolation plate 62.

In addition, as shown in FIGS. 12 and 19, the isolation plate 62 is perpendicular to the fixing frame 21 and is fixed to the bottom 22 of the base 2. The isolation plate 62 is located between the optical reception device 3 and the optical transmission device 4. It this way, the optical reception device 3 and the optical transmission device 4 may be isolated.

The fixing frame 21 is located in the cavity. In order to facilitate fastening of the top cover 1 and the base 2, a height of the fixing frame 21 needs to be matched with a distance between the top cover 1 and the base 2 in a case where the top cover 1 is fastened to the base 2. In order to form a shielding cavity, in some examples, a height of the isolation plate 62 is the same as the height of the fixing frame 21, a top of the support plate 61 is higher than a top of the fixing frame 21, and a sum of a height of the support plate 61 and the height of the isolation plate 62 is equal to the distance between the top cover 1 and the base 2 in a case where the top cover 1 is fastened to the base 2.

As shown in FIGS. 14 and 19, since the thickness of the support plate 61 is greater than the thickness of the isolation plate 62, and a length of the support plate 61 is greater than a length of the isolation plate 62, a boss is formed at a contact between the support plate 61 and the isolation plate 62. In a case where the isolation rib 6 is connected to the fixing frame 21, the support plate 61 may be clamped on the top of the fixing frame 21 by using the boss, so that the isolation plate 62 is clamped with the fixing frame 21 through the support plate 61. The support plate 61 is clamped with the fixing frame 21, which may further limit stability and shielding performance of the isolation plate 62, and prevent the isolation plate 62 from shaking due to an external force to affect the isolation effect.

Figure 16:
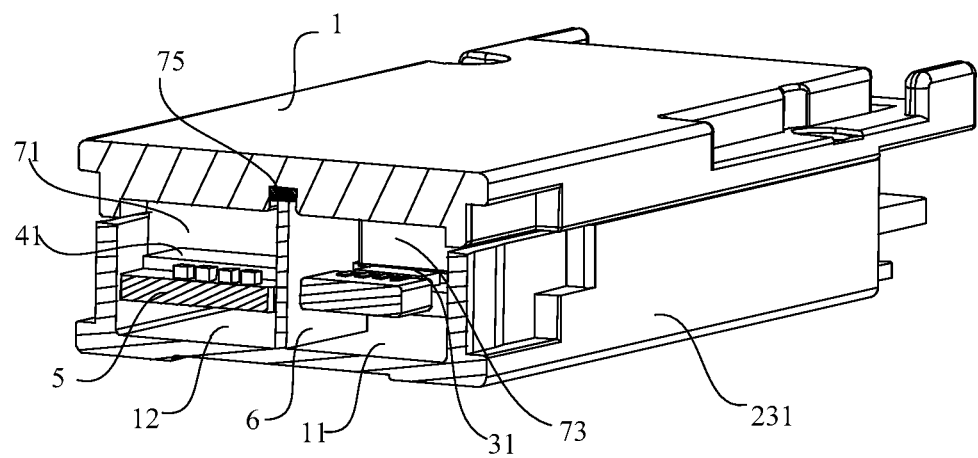
FIG. 16 is a diagram of the optical module shown in FIG. 9 taken along the section C.
Figure 18:
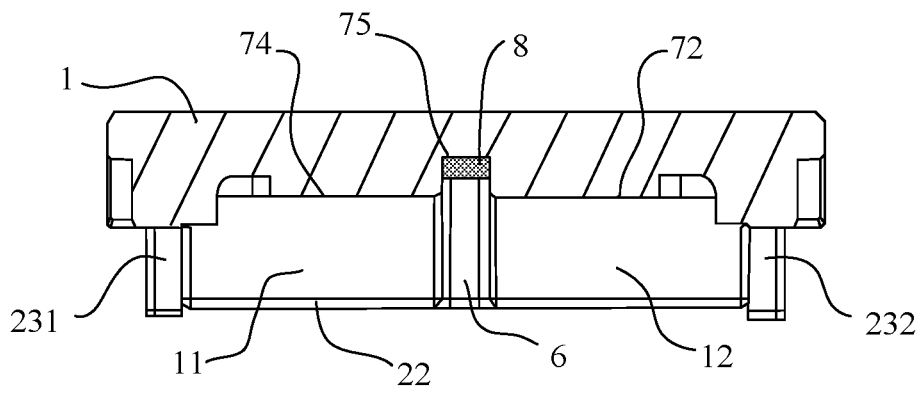
FIG. 18 is a cross-sectional view of an optical module in a shielded isolation state, in accordance with some embodiments.

In order to further improve the isolation effect of the optical module and improve the problem of mutual crosstalk between the optical reception device 3 and the optical transmission device 4, in some embodiments, as shown in FIGS. 16 and 18, a groove 75 is provided in the inner wall of the top cover 1, and the groove 75 is used in cooperation with the isolation rib 6.

For example, the groove 75 is matched with the isolation rib 6 in a nesting manner. In this way, the isolation effect may be further improved under a premise of improving the stability of the isolation rib 6.

As shown in FIG. 16, the protrusion 7, the isolation rib 6, and bottom 22 and side walls 231 and 232 of the base 2 enclose a first shielding cavity 11 and a second shielding cavity 12, the first shielding cavity 11 accommodates the optical reception device 3, and the second shielding cavity 12 accommodates the optical transmission device 4. FIG. 16 is a diagram illustrating the cross-section C in FIG. 9 after the top cover 1 and the base 2 are fastened together in the optical module, and this figure may embody structures of two shielding cavities presenting in the optical module.

FIG. 17 is a partially enlarged view of the portion D in FIG. 15 to more clearly show the structure of the protrusion 7. In order to make the protrusion 7 cooperate with the circuit board 5 to achieve shielding of the rear end of the optical reception device 3 and the rear end of the optical transmission device 4, in some examples, as shown in FIG. 17, the protrusion 7 includes a first boss 71 and a second boss 73. When the top cover 1 is placed over the base 2, the first boss 71 and the second boss 73 are located over the circuit board 5, and in a case where the top cover 1 is fastened to the base 2, the first boss 71 and the second boss 73 are in direct contact with the circuit board 5 to realize the shielding of the rear ends of the optical devices (i.e., the optical reception device 3 and the optical transmission device 4).

The first boss 71 is located over a portion of the circuit board 5 connected to the optical transmission device 4, and the second boss 73 is located over a portion of the circuit board 5 connected to the optical reception device 3. The rear end of the optical transmission device 4 is shielded after the first boss 71 is in direct contact with to the circuit board 5, and the rear end of the optical reception device 3 is shielded after the second boss 73 is in direct contact with the circuit board 5. The first boss 71 and the second boss 73 are respectively located at both sides of a position corresponding to the isolation rib 6, that is, the isolation rib 6 is located between the first boss 71 and the second boss 73 after the top cover 1 is fastened to the base 2.

In order to achieve the shielding effect, in some examples, as shown in FIG. 17, the first boss 71 and the second boss 73 are connected through a connecting arc 76 to avoid affecting the shielding effect of electromagnetic waves due to a disconnection between the first boss 71 and the second boss 73.

The first boss 71, the second boss 73 and the connecting arc 76 constitute at least part of the groove 75 for nesting the isolation rib 6, and the groove 75 is used to fix the isolation rib 6 to avoid generating a gap caused by a direct contact between the isolation rib 6 and the top cover 1, and to form two shielding cavities, so that the first shielding cavity 11 and the second shielding cavity 12 are relatively closed and independent, which may solve the problem of mutual crosstalk between the electromagnetic waves generated by the optical reception device 3 and the optical transmission device 4 to improve the isolation effect.

In order to further improve the isolation effect, in some examples, as shown in FIG. 17, the protrusion 7 further includes a first top plate 72 and a second top plate 74. The first top plate 72 is connected to the first boss 71, and the second top plate 74 is connected to the second boss 73. There is a gap between the first top plate 72 and the second top plate 74, and the gap is a part of the groove 75 to increase a depth and a length of the groove 75, so that the isolation ribs 6 may be fully nested in the groove 75 to improve the shielding effect of the isolation ribs 6 and the protrusion 7.

In this case, as shown in FIG. 18, the first top plate 72 and the second top plate 74 are both fixed on the inner wall of the top cover 1, and are located at both sides of the isolation rib 6. That is, the first top plate 72 is a top plate of the second shielding cavity 12, and the second top plate 74 is a top plate of the first shielding cavity 11.

It will be seen that in the protrusion 7, the first boss 71 and the second boss 73 are cooperated with the circuit board 5 to realize the shielding of the rear end of the optical reception device 3 and the rear end of the optical transmission device 4. Therefore, the protrusion 7, the isolation rib 6, the fixing frame 21, and the base 2 form two shielding cavities. The first shielding cavity 11 is formed by the bottom 22 of the base 2, the side wall 231 of the base 2, the fixing frame 21, the isolation rib 6, the second top plate 74 and the second boss 73, and may shield the electromagnetic waves generated by the optical reception device 3; the second shielding cavity 12 is formed by the bottom 22 of the base 2, the other side wall 232 of the base 2, the fixing frame 21, the isolation rib 6, the first top plate 72 and the first boss 71, and may shield the electromagnetic waves generated by the optical transmission device 4. As a result, the electromagnetic waves generated by the two devices may not affect each other to solve the crosstalk problem and improve the isolation effect and the working stability of the optical module.

A shape and a size of the groove 75 may be matched with a structure of the isolation rib 6, so as to achieve the nesting of the groove 75 and the isolation rib 6 and avoid generating a gap. In some examples, the isolation rib 6 adopts a flat plate-shaped structure, a width of the groove 75 is slightly greater than or equal to the thickness of the isolation rib 6, and the groove 75 has a linear structure, so that the isolation rib 6 can be nested in the groove 75. In some other examples, the isolation rib 6 adopts a wavy curved plate-shaped structure, and a structure of the groove 75 is the same as the structure of the isolation rib 6, so that a gap may not be generated after the isolation rib 6 is nested in the groove 75.

In some examples, the isolation rib 6 adopts the structure as shown in FIG. 14, the width of the groove 75 is slightly greater than or equal to the thickness of the support plate 61, the length of the groove 75 is slightly greater than or equal to the length of the support plate 61, and a shape of the groove 75 is similar to a shape of the support plate 61, so that the support plate 61 may be nested into the groove 75 to fix the isolation plate 62, which may avoid generating a gap between the isolation rib 6 and the groove 75 to affect the isolation effect, and improve the stability of the isolation rib 6.

In order to improve the shielding effect, in some embodiments, a metal layer, e.g., a copper layer or a metal flexible sheet, may also be provided on an end face of the circuit board 5. In some examples, as shown in FIG. 16, a first flexible sheet 31 is provided on an end face of the circuit board 5 that is to be connected to the optical reception device 3, and a second flexible sheet 41 is provided on an end face of the circuit board 5 that is to be connected to the optical transmission device 4. For example, both the first flexible sheet 31 and the second flexible sheet 41 may be tin paper sheets.

As shown in FIG. 16, the first flexible sheet 31 is directly opposite to the second boss 73, and the second flexible sheet 41 is directly opposite to the first boss 71. Thus, in a case where the top cover 1 is fastened to the base 2, the first flexible sheet 31 is pressed by the second boss 73, and the second flexible sheet 41 is pressed by the first boss 71, so as to ensure a tight attachment between the second boss 73 and the first flexible sheet 31, and a tight attachment between the first boss 71 and the second flexible sheet 41, and further realize the shielding of the rear ends of the optical devices.

In some embodiments, a flexible structure is provided between the groove 75 and the isolation rib 6. In this way, when the two rigid structures are connected to each other, a gap may not be generated between the groove 75 and the isolation rib 6, which is conductive to forming a closed space.

Figure 20:
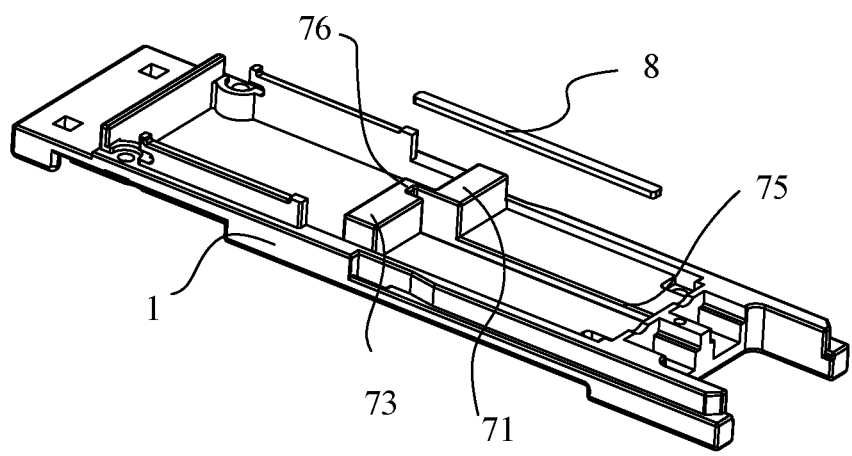
FIG. 20 is a schematic structural diagram of a top cover, in accordance with some embodiments.

In some examples, as shown in FIGS. 19 and 20, a conductive foam 8 is provided in the groove 75, and the conductive foam 8 is used to realize tight nesting of the groove 75 and the isolation rib 6.

The conductive foam 8 is provided in the groove 75 to ensure that the gap between the isolation rib 6 and the groove 75 is completely filled, which makes the top cover 1 and the base 2 fully in contact and conducted to avoid leakage of electromagnetic waves from the gap between the top cover 1 and the base 2, and then better play a role of electromagnetic shielding, so that the first shielding cavity 11 and the second shielding are formed by the first boss 71, the second boss 73, the isolation rib 6 and the base 2 to accommodate each optical device separately, isolate mutual radiation and crosstalk between the two devices, improve the isolation effect, and ensures the normal operation of the optical module.

The conductive foam 8 may be, for example, in direct contact with the isolation plate 62. In this case, the isolation rib 6 does not include the support plate 61. Of course, the conductive foam 8 may also be in direct contact with the support plate 61, if the support plate 61 is included.

It will be seen that, in the optical module provided by the embodiments of the present disclosure, the isolation rib 6 is provided on the base 2, and the protrusion 7 is provided on the top cover 1. Through nesting and match of the isolation rib 6 and the groove 75, the optical reception device 3 is located in the first shielding cavity 11 and the optical transmission device 4 is located in the second shielding cavity 12 to isolate the two devices, so that the electromagnetic waves generated by the two devices themselves will not affect each other, thereby solving the crosstalk problem, improving the isolation effect and the working stability of the optical module.

It will be seen from the above technical solutions that, the optical module provided by some embodiments of the present disclosure includes the top cover 1 and the base 2, the isolation rib 6 is fixed on the bottom 22 of the base 2 and is perpendicular to the fixing frame 21, and the fixing frame 21 is used to shield a front end of the optical reception device and a front end of the optical transmission device. The top cover 1 is used for shielding the space above the optical reception device 3 and the space above the optical transmission device 4. The bottom 22 of the base 2 is used for shielding the space below the optical reception device 3 and the space below the optical transmission device 4. The downward protrusion 7 provided on the inner wall of the top cover 1 abuts against the circuit board 5 to shield the rear end of the optical reception device 3 and the rear end of the optical transmission device 4.

When the optical reception device 3 and the optical transmission device 4 are mounted on the base 2 by the fixing frame 21, the isolation rib 6 is located between the optical reception device 3 and the optical transmission device 4, the isolation rib 6 is used for shielding the right side of the optical reception device 3 and the left side of the optical transmission device 4, and the two side walls 231 and 232 of the base 2 are used for shielding the left side of the optical reception device 3 and the right side of the optical transmission device 4. It will be seen that, in the optical module provided by some embodiments of the present disclosure, the optical reception device 3 and the optical transmission device 4 may be isolated to prevent the electromagnetic waves radiated outwards by the two optical devices from generating the crosstalk phenomenon to affect each other, thereby ensuring the performances of the optical reception device 3 and the optical transmission device 4 and the normal operation of the optical module. The optical module has a simple structure and a low cost, and may achieve a good isolation effect to solve the mutual crosstalk problem between two optical devices.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. An optical transmission-reception module, comprising:
a top cover;
a base to which the top cover is fitted to form a cavity;
an optical reception device and an optical transmission device that are encapsulated in the cavity, and the optical transmission device including:
an optical waveguide substrate, wherein the optical waveguide substrate includes a surface, a first reflection inclined surface connected to the surface and second reflection inclined surfaces, an angle between the surface and the first reflection inclined surface is an acute angle, and a plane parallel to the surface and each second reflection inclined surface have an angle therebetween;
a plurality of laser assemblies disposed on the surface of the optical waveguide substrate, the laser assemblies being configured to emit laser beams towards the surface of the optical waveguide substrate;
an optical multiplexing assembly disposed in the optical waveguide substrate, the optical multiplexing assembly being configured to combine the laser beams emitted by the plurality of laser assemblies into a laser beam;
a plurality of main waveguides disposed inside the optical waveguide substrate, light inlet ends of the main waveguides facing the first reflection inclined surface, and light outlet ends of the main waveguides being communicated with the optical multiplexing assembly, wherein the first reflection inclined surface is configured to reflect the laser beams emitted by the laser assemblies to the main waveguides;
a plurality of power detectors disposed on the surface of the optical waveguide substrate, the power detectors being configured to detect power of the laser beams emitted by the laser assemblies, respectively; and
a plurality of secondary waveguides disposed inside the optical waveguide substrate, each secondary waveguide being communicated with a corresponding main waveguide, and configured to transmit a laser beam from the corresponding main waveguide to a corresponding second reflection inclined surface; wherein
each second reflection inclined surface is configured to reflect a received laser beam into a corresponding power detector; and
geometric centers of the main waveguides, geometric centers of the secondary waveguides, and a geometric center of the optical multiplexing assembly are located in a same plane parallel to the surface of the optical waveguide substrate;
an isolation rib located between the optical reception device and the optical transmission device, the optical reception device being disposed between the isolation rib and a side wall of the base, and the optical transmission device being disposed between the isolation rib and an opposite side wall of the base;
a fixing frame located in the cavity and perpendicular to the isolation rib, an end of the optical reception device and an end of the optical transmission device being in direct contact with the fixing frame, and another end of the optical reception device and another end of the optical transmission device being electrically connected to the circuit board; and
a protrusion extending from an inner wall of the top cover, and located at a side of the optical transmission device and the optical reception device that is away from the fixing frame.

2. The optical transmission-reception module according to claim 1, wherein geometric centers of the main waveguides and a geometric center of the optical multiplexing assembly are located in a same plane parallel to the surface of the optical waveguide substrate.

3. The optical transmission-reception module according to claim 1, wherein the plurality of laser assemblies are located on one end of the optical waveguide substrate where the first reflection inclined surface is located.

4. The optical transmission-reception module according to claim 1, wherein the angle between the surface and the first reflection inclined surface of the optical waveguide substrate is in a range from 40 degrees to 50 degrees.

5. The optical transmission-reception module according to claim 1, wherein a plurality of first grooves are provided in the surface of the optical waveguide substrate, photosensitive surfaces of the power detectors are located over corresponding first grooves, and surfaces of the first grooves facing the light outlet ends of corresponding secondary waveguides are the second reflection inclined surfaces.

6. The optical transmission-reception module according to claim 1, wherein the angle between the plane parallel to the surface and each second reflection inclined surface of the optical waveguide substrate is in a range from 40 degrees to 50 degrees.

7. The optical transmission-reception module according to claim 1, wherein the plurality of main waveguides have a linear structure, the plurality of main waveguides extend substantially towards a light-emitting direction of the optical transmission device, and the light-emitting direction of the optical transmission device is parallel to an axial direction of the optical fiber adapter.

8. The optical transmission-reception module according to claim 7, wherein a secondary waveguide in the secondary waveguides has a linear structure, and an extension direction of the secondary waveguide is perpendicular to an extension direction of a main waveguide communicated with the secondary waveguide.

9. The optical transmission-reception module according to claim 7, wherein a secondary waveguide in the secondary waveguides has an L-shaped structure, the secondary waveguide includes a first waveguide section and a second waveguide section that are perpendicular to each other, an extension direction of the first waveguide section is perpendicular to an extension direction of a main waveguide communicated with the first waveguide section, and an extension direction of the second waveguide section is substantially parallel to the extension direction of the main waveguide communicated with the first waveguide section.

10. The optical transmission-reception module according to claim 1, wherein a laser assembly in the laser assemblies includes:
a laser chip and a heat sink that are connected to each other, a light-emitting surface of the laser chip being attached to the surface of the optical waveguide substrate, and the heat sink is attached to the surface of the optical waveguide substrate;
a ground metal layer disposed on a side wall of the heat sink that is connected to the laser chip, the ground metal layer being electrically connected to a cathode of the laser chip and a ground circuit of the circuit board; and a connecting circuit disposed on at least a surface of the heat sink facing away from the optical waveguide substrate, the connecting circuit being electrically connected to an anode of the laser chip and a driving circuit of the circuit board, and the driving circuit being configured to drive the laser chip to emit light.

11. The optical transmission-reception module according to claim 10, further comprising an optical matching glue disposed between the laser chip and the optical waveguide substrate, a refractive index of the optical matching glue being between a refractive index of the laser chip and a refractive index of the optical waveguide substrate.

12. The optical transmission-reception module according to claim 1, further comprising a second groove on the inner wall of the top cover and matched with the isolation rib in a nesting manner; and the isolation rib is configured to divide the cavity into a first shielding cavity and a second shielding cavity such that the protrusion, the isolation rib, the fixing frame and the base enclose the first shielding cavity and the second shielding cavity, the optical reception device is located in the first shielding cavity, and the optical transmission device is located in the second shielding cavity.

13. The optical transmission-reception module according to claim 12, wherein the protrusion includes:

a first boss and a second boss that located at the side of the optical transmission device and the optical reception device that is away from the fixing frame; and a connecting arc connecting the first boss to the second boss, the first boss, the second boss and the connecting arc constituting at least part of the second groove.

14. The optical transmission-reception module according to claim 13, wherein the protrusion further includes a first top plate and a second top plate spaced apart, the first top plate is connected to the first boss, the second top plate is connected to the second boss, and a gap between the first top plate and the second top plate is a portion of the second groove.

15. The optical transmission-reception module according to claim 13, further comprising a conductive foam disposed in the second groove, the conductive foam being located between a bottom of the second groove and the isolation rib.

16. The optical transmission-reception module according to claim 1, further comprising metal flexible sheets disposed on a side face of the circuit board and directly opposite to the protrusion, and the metal flexible sheets are configured such that the metal flexible sheets are extruded by the protrusion when the top cover and the base are fitted, so that the protrusion is in contact with the metal flexible sheets.

* * * * *